(12) United States Patent
Chen et al.

(10) Patent No.: US 10,763,404 B2
(45) Date of Patent: Sep. 1, 2020

(54) LIGHT EMITTING DEVICE WITH BEVELED REFLECTOR AND MANUFACTURING METHOD OF THE SAME

(71) Applicant: MAVEN OPTRONICS CO., LTD., Hsinchu (TW)

(72) Inventors: Chieh Chen, Palo Alto, CA (US); Tsung-Hsi Wang, Hsinchu (TW)

(73) Assignee: Maven Optronics Co., Ltd., Hsinchu County (TW)

( * ) Notice: Subject to any disclaimer, the term of this patent is extended or adjusted under 35 U.S.C. 154(b) by 20 days.

(21) Appl. No.: 15/280,927

(22) Filed: Sep. 29, 2016

(65) Prior Publication Data

US 2017/0098743 A1 Apr. 6, 2017

(30) Foreign Application Priority Data

Oct. 5, 2015 (TW) .............................. 104132711 A
Jan. 19, 2016 (CN) .......................... 2016 1 0033451

(51) Int. Cl.
*H01L 33/50* (2010.01)
*H01L 33/48* (2010.01)
(Continued)

(52) U.S. Cl.
CPC ............ *H01L 33/507* (2013.01); *H01L 33/46* (2013.01); *H01L 33/486* (2013.01);
(Continued)

(58) Field of Classification Search
CPC ...... H01L 33/54; H01L 33/507; H01L 33/505
See application file for complete search history.

(56) References Cited

U.S. PATENT DOCUMENTS 9,761,769 B2 * 9/2017 Cui .................. H01L 33/508
2005/0205876 A1 9/2005 Harada et al.
(Continued)

FOREIGN PATENT DOCUMENTS

CN          102165611 A     8/2011
JP         2013-077679 A    4/2013
(Continued)

OTHER PUBLICATIONS

Extended Search Report for European Patent Application No. 16192043.4, dated Mar. 13, 2017, 8 pages.
(Continued)

*Primary Examiner* — Yu-Hsi D Sun
(74) *Attorney, Agent, or Firm* — Foley & Lardner LLP

(57) ABSTRACT

A light emitting device, including an LED semiconductor die, a photoluminescent structure and a reflector, is disclosed. The photoluminescent structure with a beveled edge surface is disposed on top of the LED semiconductor die, wherein a lower surface of the photoluminescent structure adheres to an upper surface of the LED semiconductor die. A reflective resin material is disposed surrounding edge surfaces of the LED semiconductor die and the photoluminescent structure forming a beveled reflector. A method to manufacture the above light emitting device is also disclosed. Advantages of this light emitting device with beveled reflector include increasing the light extraction efficiency, making the viewing angle tunable, improving spatial color uniformity and reducing the light source etendue realized in a compact form-factor size.

17 Claims, 21 Drawing Sheets

(51) Int. Cl.
  *H01L 33/46* (2010.01)
  *H01L 33/60* (2010.01)
  *H01L 33/58* (2010.01)
  *H01L 33/56* (2010.01)

(52) U.S. Cl.
  CPC ............ *H01L 33/505* (2013.01); *H01L 33/60* (2013.01); *H01L 33/56* (2013.01); *H01L 33/58* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 2009/0321758 A1* | 12/2009 | Liu | H01L 33/505 257/98 |
| 2011/0175117 A1 | 7/2011 | Jagt et al. | |
| 2013/0113010 A1* | 5/2013 | Brunner | H01L 33/005 257/98 |
| 2013/0288406 A1 | 10/2013 | Chen et al. | |
| 2015/0050760 A1 | 2/2015 | Imazu et al. | |
| 2015/0175811 A1 | 6/2015 | Inada et al. | |
| 2015/0263242 A1 | 9/2015 | Tomizawa et al. | |
| 2016/0372645 A1 | 12/2016 | Sakai et al. | |

FOREIGN PATENT DOCUMENTS

| | | |
|---|---|---|
| JP | 2013-526047 A | 6/2013 |
| JP | 2015-173142 A | 10/2015 |
| JP | 2015-228397 A | 12/2015 |
| TW | 201205899 A | 2/2012 |
| TW | 201225348 A | 6/2012 |
| TW | 201344987 A | 11/2013 |
| TW | 201408758 A | 3/2014 |
| TW | 201517329 A | 5/2015 |
| TW | 201533120 A | 9/2015 |
| WO | WO-2010/035206 A1 | 4/2010 |
| WO | WO-2013/137356 A1 | 9/2013 |
| WO | WO-2014/091914 A1 | 6/2014 |
| WO | WO-2015/025247 A1 | 2/2015 |
| WO | WO-2015/036887 A1 | 3/2015 |
| WO | WO-2015/104623 A1 | 7/2015 |

OTHER PUBLICATIONS

Office Action for Taiwan Patent Application No. 104132711, dated Jun. 23, 2016, 10 pages.
Office Action for Taiwan Patent Application No. 104132711, dated Sep. 30, 2016, 3 pages.
Search Report for Taiwan Patent Application No. 104132711, dated Jun. 23, 2016, 1 page.
Office Action for Korean Patent Application No. 10-2016-0127825, dated May 4, 2017, 10 pages.
Chinese Search Report for corresponding Chinese Patent Application No. 2016100334514.4, dated Apr. 13, 2018, 2 pages.
First Examination Report for corresponding European Patent Application No. 16192043.4, dated Jan. 29, 2019, in 8 pages.
Office Action for corresponding Japanese Patent Application No. 2016-197250, dated Jan. 18, 2018, 4 pages.
Office Action for corresponding Japanese Patent Application No. 2016-197250, dated Jun. 5, 2018, 3 pages.
Office Action for corresponding Japanese Patent Application No. 2016-197250, dated Apr. 2, 2019, 2 pages.
Office Action for corresponding Korean Patent Application No. 10-2016-127825, dated Oct. 30, 2017, 6 pages.
Office Action in corresponding European Patent Application No. 16192043.4, dated Jul. 4, 2019, 8 pages.

\* cited by examiner

LIGHT EMITTING DEVICE WITH BEVELED REFLECTOR AND MANUFACTURING METHOD OF THE SAME

CROSS-REFERENCES TO RELATED APPLICATIONS

This application claims the benefit of and priority to Taiwan Patent Application No. 104132711 filed on Oct. 5, 2015, and Chinese Patent Application No. 201610033451.4 filed on Jan. 19, 2016, which also claims priority to the Taiwan Patent Application, the disclosures of which are incorporated herein by reference in their entirety.

BACKGROUND

Technical Field

The present disclosure relates to a light emitting device and the manufacturing method thereof, in particular to a chip-scale packaging light emitting device including a light emitting diode (LED) semiconductor die which generates electromagnetic radiation while it is in operation.

Description of the Related Art

In the past decades, LEDs are widely used in applications including signal lamps, backlight units, general lightings, mobile components, automotive lightings and so forth. Generally an LED semiconductor die is disposed within a package structure, and/or covered by a photoluminescent material along a light irradiation path, to form a light emitting device.

Good light extraction efficiency of a light emitting device and a desired viewing angle mandated by applications can both be achieved through a proper geometric design of a package structure. For example, the traditional Plastic Leaded Chip Carrier (PLCC) LED package is widely used as an economical package structure to form white LEDs. For PLCC-type package structure, light extraction efficiency as well as the desired viewing angle can be optimized effectively through a proper design of the shape of a reflective cup surface. However, there are intrinsic limitations in PLCC-type LEDs, including: 1) Poor spatial color uniformity, due to large variations of the lengths along various optical paths of different light emitting angles, which will result in a projected yellow ring or a blue ring; 2) The light emitting surface area of a PLCC-type phosphor-converted light emitting device is significantly larger than that of a LED semiconductor die that is bonded inside the package. A larger light emitting surface area will result in larger etendue of the LED as a light source and complicates the design of a secondary optical lens accordingly; and 3) PLCC-type LED package has poor heat dissipation due to relatively higher thermal resistance between the LED semiconductor die and a lead frame.

Recently, another approach to fabricate much smaller form-factor phosphor-converted LEDs using flip-chip LED semiconductor dies, the so-called chip-scale packaging (CSP), can effectively address those problems commonly found in PLCC-type LEDs. Advantages of CSP-type LEDs include, but are not limited to, an approximately ideal point light source because of a chip-scale compact light emitting surface area, and excellent heat dissipation path due to a flip-chip design. Furthermore, its simplified manufacturing process lowers manufacturing costs to fabricate CSP-type LEDs compared to PLCC-type LEDs.

However, some of the good optical properties commonly found in conventional PLCC-type LED packages are lost for CSP-type LEDs due to continuous shrinkage of the package size. For example, for those CSP-type LEDs, four edge surfaces of a photoluminescent structure, which are surrounded by reflectors on the four surfaces, are four vertically flat surfaces perpendicular to the light emitting (top) surface due to limitations of existing manufacturing processes. One drawback of the vertically flat reflector design is that most of the light inside the photoluminescent structure travelling toward the vertically flat side-reflector will be reflected back and trapped within the photoluminescent structure, and, even worse, be reflected into and absorbed by the LED semiconductor die, due to total internal reflection occurring at the top surface of the photoluminescent structure. This kind of package structure will reduce package extraction efficiency because more light will not be able to escape from the photoluminescent structure after wavelength conversion, resulting in a significant amount of optical energy loss inside the package structure of a light emitting device. Besides, there is still no proper solution currently provided to change the viewing angle of CSP-type LEDs.

Therefore, there is a need to design an improved CSP-type LED structure to further increase light extraction efficiency, improve the spatial color uniformity, reduce the radiation area to approximately an ideal point source, lower thermal resistance, and make the viewing angle tunable.

SUMMARY

One object of some embodiments of the present disclosure is to provide a light emitting device and a manufacturing method thereof, to achieve better light extraction efficiency, improved spatial color uniformity without projected color ring, a smaller irradiation area, lowered thermal resistance to provide better heat dissipation, and a tunable viewing angle suitable for different applications.

Another object of some embodiments of the present disclosure is to provide a small form-factor CSP-type light emitting device and a manufacturing method thereof, to achieve better light extraction efficiency, improved spatial color uniformity without projected color ring, a smaller irradiation area, lowered thermal resistance to provide better heat dissipation, and a tunable viewing angle suitable for different applications.

To achieve these objects, a light emitting device comprising an LED semiconductor die, a photoluminescent structure, and a reflector is disclosed according to some embodiments of the present disclosure. The LED semiconductor die comprises an upper surface, a lower surface in parallel but on the opposite side to the upper surface, an edge surface, and a set of electrodes. The edge surface extends between the upper surface and the lower surface, whereas the set of electrodes is disposed on the lower surface. The photoluminescent structure is disposed on the top of the LED semiconductor die, wherein the photoluminescent structure comprises an upper surface, a lower surface in parallel but on the opposite side to the upper surface, and an edge surface extending between the upper surface and the lower surface. The size of the upper surface of the photoluminescent structure is larger than that of the lower surface of the photoluminescent structure. A beveled edge surface is therefore formed between the larger upper surface and the smaller lower surface of the photoluminescent structure. Moreover, the lower surface of the photoluminescent structure is adjacent to the upper surface of the LED semiconductor die. A reflective material is disposed surrounding the vertical edge surfaces of the LED semiconductor die and the beveled edge surfaces of the photoluminescent structure, forming a beveled reflector.

To achieve the objects above, a manufacturing method of the light emitting device according to some embodiments of the present disclosure comprises forming a photoluminescent structure shaped like a reverse pyramidal frustum, attaching the photoluminescent structure on top of an LED semiconductor die to form an electro-luminescent structure, and disposing a reflective material surrounding the electro-luminescent structure to form a beveled reflector.

To further achieve the objects above, a photoluminescent structure according to some embodiments of the present disclosure comprises a first major surface (e.g., an upper surface), a second major surface (e.g., a lower surface) opposite to the first major surface, an edge surface extending between the first major surface and the second major surface, and phosphor particles disposed within the photoluminescent structure, wherein a surface area of the first major surface is larger than a surface area of the second major surface, such that the edge surface of the photoluminescent structure is a beveled edge surface, a first dimension (e.g., a width) of the first major surface is equal to or less than 2.0 mm, and a second dimension (e.g., a length) of the first major surface, which is orthogonal to the first dimension, is equal to or less than 3.0 mm.

Thus, the improved LED device according to some embodiments of the present disclosure provides at least the following benefits: 1. the beveled shaped reflector surrounding the electro-luminescent structure provides better extraction of the light irradiated within the electro-luminescent structure and thus improves the optical efficiency and/or the spatial color uniformity; 2. the dimensions of the photoluminescent structure can be fabricated to be just slightly larger than that of the LED semiconductor die so that an overall compact-size light emitting device is formed; 3. the photoluminescent structure with beveled edge surfaces can be fabricated in a mass-production process to lower manufacturing costs; and 4. the slanted angle of the beveled edge surfaces can further be adjusted by appropriate fabrication process, thus making the viewing angle of a CSP-type LED tunable.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIGS. 22D and 22E further show the light paths inside a light emitting device; and FIG. 22C shows the light paths inside a light emitting device having a randomly dispersed photoluminescent material.

DETAILED DESCRIPTION

Definitions

Figure 1:
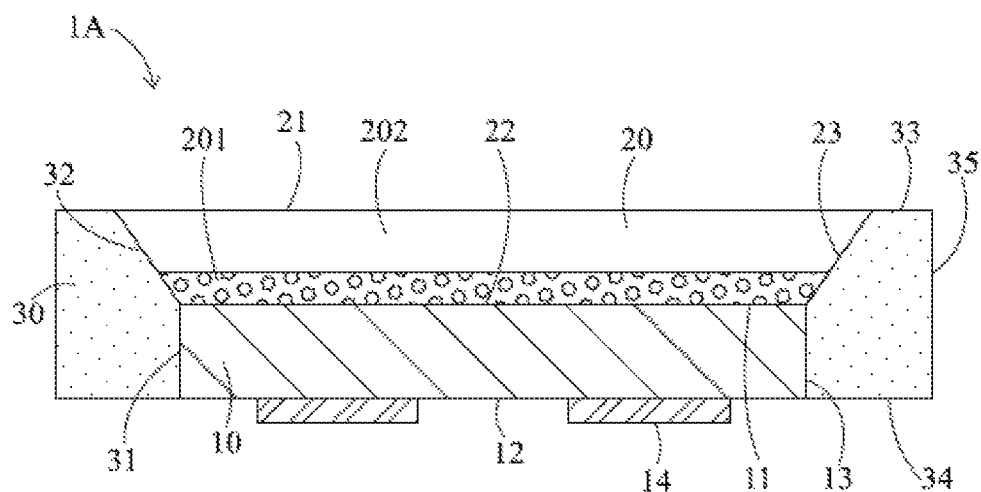
FIG. 1 is a schematic drawing in a cross-sectional view depicting a light emitting device according to one embodiment of the present disclosure.

The following definitions apply to some of the technical aspects described with respect to some embodiments of the invention. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

As shown in FIG. 1, a first embodiment of a light emitting device disclosed according to the present disclosure is schematically illustrated. The light emitting device 1A comprises an LED semiconductor die 10, a photoluminescent structure 20, and a reflector 30.

The LED semiconductor die 10 is a flip-chip semiconductor die having an upper surface 11, a lower surface 12, an edge surface 13, and a set of electrodes 14. The upper surface 11 and the lower surface 12 are formed in parallel, facing oppositely to each other. The edge surface 13 is formed between the upper surface 11 and the lower surface 12, connecting an outer rim of the upper surface 11 with that of the lower surface 12. A set of electrodes 14, or a plurality of electrodes, is disposed on the lower surface 12. Electric energy is applied to the LED semiconductor die 10 through the set of electrodes 14 so that electro-luminescence is generated. Photons generally irradiate from the upper surface 11 and the edge surface 13 of the LED semiconductor die 10.

The photoluminescent structure 20 having an upper surface 21, a lower surface 22, and an edge surface 23 as illustrated in FIG. 1 is used to convert the substantially monochromatic wavelength of the light emitted by the LED semiconductor die 10 into lower-energy light with longer wavelength. The upper surface 21 and the lower surface 22 of the photoluminescent structure 20 are formed in parallel facing oppositely to each other. The edge surface 23 is formed between the upper surface 21 and the lower surface 22 connecting an outer rim of the upper surface 21 with that of the lower surface 22. The upper surface 21 and the lower surface 22 are substantially horizontal and parallel to each other.

The size of a surface area for the upper surface 21 is larger than that of the lower surface 22, forming a reverse-pyramidal-frustum shaped structure. For example, the size of the surface area for the upper surface 21 can be about 1.1× or more the size of the surface area of the lower surface 22, such as about 1.2× or more, about 1.3× or more, about 1.4× or more, or about 1.5× or more. Because the size of the surface area for the upper surface 21 is larger than that of the lower surface 22, the edge surface 23 shows a beveled edge surface connecting along the rims of the upper surface 21 and that of the lower surface 22. For example, a slanted angle between the edge surface 23 and a horizontal plane (parallel to the lower surface 22) can be less than about 90°, such as about 88° or less, about 85° or less, or about 80° or less.

The photoluminescent structure 20 further includes a phosphor layer 201 and at least one transparent layer 202, where the transparent layer 202 is formed and stacked on top of the phosphor layer 201 toward an ambient environment. The phosphor layer 201 further includes one type or a plurality of types of phosphors in a form of particles mixed inside a transparent material. When the light emitted from the LED semiconductor die 10 passes through the phosphor layer 201, partial light is wavelength-converted, and then keeps passing through the transparent layer 202 before it escapes from the inside of the light emitting device 1A to the ambient environment.

Working together with the beveled reflector 30, the transparent layer 202 functions as a primary optical lens and shapes the irradiation pattern of the light emitting device 1A. Additionally, the transparent layer 202 serves as a barrier layer protecting the phosphor layer 201 from the ambient environment.

The photoluminescent structure 20 is disposed on top of the LED semiconductor die 10 so that the lower surface 22 of the photoluminescent structure 20 is adjacent to the upper surface 11 of the LED semiconductor die 10. It is desired that the lower surface 22 of the photoluminescent structure 20 adheres to the upper surface 11 of the LED semiconductor die 10 without a gap using an adhesive resin material, such as silicone resin (not shown in FIG. 1), which results in better light extraction between the photoluminescent structure 20 and the LED semiconductor die 10. Also, the size of the lower surface 22 of the photoluminescent structure 20 is equal to or slightly larger than that of the upper surface 11 of the LED semiconductor die 10, so that the photoluminescent structure 20 substantially completely covers the LED semiconductor die 10 as seen from the top view. For example, the size of the surface area of the lower surface 22 of the photoluminescent structure 20 can be about 1× or more the size of a surface area of the upper surface 11 of the LED semiconductor die 10, such as about 1.01× or more, or about 1.05× or more. In this arrangement, light that is leaking directly from the LED semiconductor die 10 without passing through the photoluminescent structure 20 can be avoided.

In FIG. 1, a reflective resin material is disposed surrounding both the vertical edge surface 13 of the LED semiconductor die 10 and the beveled edge surface 23 of the photoluminescent structure 20 to form the reflector 30. In this embodiment, the beveled edge surface 23 is substantially completely covered by the reflector 30. The light from the LED semiconductor die 10 emitting toward the edge surface 13 of the LED semiconductor die 10 will be substantially reflected back by the reflector 30, forcing the light to escape from the upper surface 11 of the LED semiconductor die 10 and to pass through the photoluminescent structure 20. Either the emitted light or the wavelength-converted light travelling toward the beveled edge surface 23 of the photoluminescent structure 20 will also be substantially reflected back, redirected and finally escaping the light emitting device 1A from the upper surface 21.

It is desired that there is substantially no gap between the reflector 30 and the edge surface 13 of the LED semiconductor die 10. A gap will create an optical cavity trapping the reflected light, thus reducing the package extraction efficiency. Similarly, it is desired that there is substantially no gap between the reflector 30 and the beveled edge surface 23 of the photoluminescent structure 20. In other words, a lower inner edge surface 31 of the reflector 30 is directly adjoining the edge surface 13 of the LED semiconductor die 10, and an upper inner beveled edge surface 32 of the reflector 30 is directly adjoining the beveled edge surface 23 of the photoluminescent structure 20. The outer beveled edge surface 23 of the photoluminescent structure 20 is shaped like a reverse pyramid; so is the inner beveled edge surface 32 shaped like a reverse pyramid, thus forming the reflector 30 having an inner beveled reflective surface accordingly. For example, a slanted angle between the inner beveled edge surface 32 and a horizontal plane (parallel to an upper rim surface 33 of the reflector 30) can be less than about 90°, such as about 88° or less, about 85° or less, or about 80° or less. Furthermore, the upper rim surface 33 of the reflector 30 is formed at substantially the same height level as the upper surface 21 of the photoluminescent structure 20. In other words, the upper rim surface 33 is substantially coplanar with the upper surface 21. The reflector 30 also includes an outer vertical edge surface 35, in addition to the lower inner edge surface 31 and the upper inner beveled edge surface 32.

In an embodiment, the reflector 30 is fabricated using a transparent and malleable resin material, wherein scattering (reflective) particles are dispersed. In one embodiment, a malleable resin material, such as polyphthalamide (PPA), polycyclohexylene-dimethylene terephthalate (PCT), or epoxy molding compound (EMC), is used to form the beveled shape for the reflector 30. Another example transparent malleable resin material can be a silicone resin with high Refractive Index (RI) (the RI is desirably between about 1.45 and about 1.55) or a low Refractive Index silicone resin (the RI is desirably between about 1.35 and about 1.45). Example scattering (reflective) particles dispersed within the transparent and malleable resin material include, $TiO_2$, BN, $SiO_2$, $Al_2O_3$, or a combination of those particles. Other oxide, nitride, and ceramic particles can be used. It is desired that the particle size of the scattering (reflective) particles is about half wavelength of the visual light spectrum, for example ranging from about 150 nm to about 450 nm. It will be appreciated that the reflector 30 can also be made of other electronic encapsulation or packaging materials or the like.

The embodiment of the light emitting device with beveled reflector 1A shows at least the following technical merits.

Figure 13A:
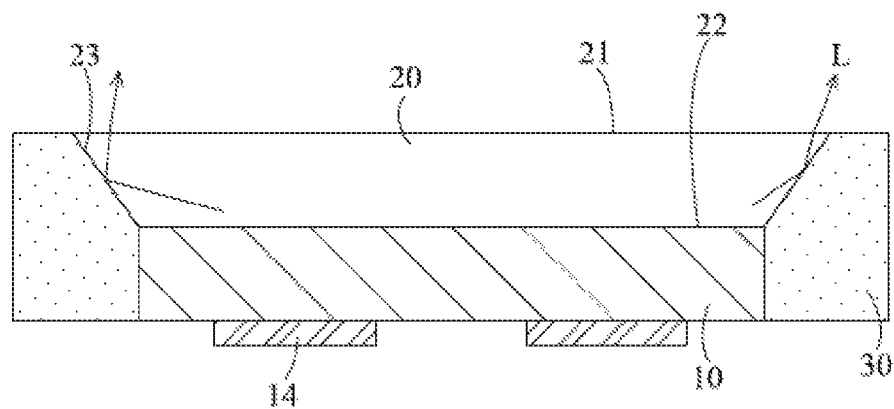
FIG. 13A and FIG. 13B are schematic drawings illustrating light paths inside various embodiments of LED packaging structures (the hatching section of the photoluminescent structure is not shown).
Figure 13B:
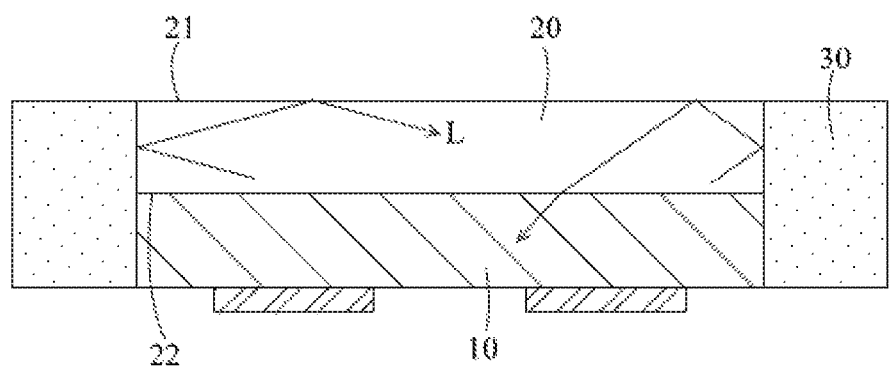

As shown in FIG. 13A, the light beam L, either emitted directly by the LED semiconductor die 10 or converted by the phosphor layer 201, can be redirected toward the ambient environment from the photoluminescent structure 20 more effectively by means of a proper design of the shape of the beveled reflector 30. In other words, the inner beveled edge surface 32 adjacent to the beveled edge surface 23 promotes light extraction out of the light emitting device 1A by redirecting the light beam L escaping to the outside environment from the upper surface 21 of the photoluminescent structure 20 and reducing the possibility of the light beam L being reflected back to the photoluminescent structure 20 or to the LED semiconductor die 10. Therefore, the light emitting device 1A with the beveled reflector 30 according to this embodiment decreases the optical energy loss by better extraction of the light either generated directly from the LED semiconductor die 10 or converted from the photoluminescent structure 20. Thus, the improvement on light extraction efficiency of the light emitting device 1A results in generally about 5%-about 20% better overall optical efficiency as compared to that of a conventional LED device without incorporating a beveled reflector. By contrast, as shown in FIG. 13B, the reflector 30 adjacent to the photoluminescent structure 20 without a beveled edge surface will cause the light L be easily reflected back to the photoluminescent structure 20 itself or to the LED semiconductor die 10 due to the effect of total internal reflection occurring at the upper surface 21. Therefore, in comparison with the light emitting device without a beveled reflector, the light emitting device 1A shows the benefit of improving the light extraction efficiency by incorporating the beveled shaped reflector 30 adjacent to the beveled edge surface 23 of the photoluminescent structure 20.

In addition to the benefit of improving the light extraction efficiency, the phosphor layer 201 is desired to be in a substantially uniform thin-film structure, which provides good spatial color uniformity and thus avoids the generation of yellow ring during projection. Also, adjusting the slanted shape of the beveled reflector 30 adjacent to the beveled edge surface 23 will result in different viewing angles of the light emitting device 1A. It is therefore achievable to tune the viewing angle of the light emitting device 1A suitable for different applications through designing the slanted angle of the beveled edge surface 23.

Furthermore, the light extraction efficiency can also be enhanced by introducing the transparent layer 202 with RI lower than that of the phosphor layer 201. In other words, RI of the transparent layer 202 can be chosen to be between the RIs of the phosphor layer 201 and the ambient air, which can further reduce the optical loss due to total internal reflection when the light passes through the phosphor layer 201 and the transparent layer 202 before escaping into the ambient air.

Another embodiment of the transparent layer 202 is a multi-layer transparent layer (not shown in FIG. 1) with a gradient of RIs among layers, wherein the RI decreases outwardly and gradually layer by layer, which further improves the light extraction efficiency.

Besides, the size of the photoluminescent structure 20 is desired to be slightly larger than that of the LED semiconductor die 10, so that substantially no light will be leaked directly from the LED semiconductor die 10 to the ambient air without passing through the photoluminescent structure 20. Also, the size of the photoluminescent structure 20 is kept almost as compact as the LED semiconductor die 10. Together with a compact design of the reflector 30, the light emitting device 1A is formed to be small in size. Thus the light emitting device 1A belongs to the category of chip-scale packaging-type LEDs (CSP-type LEDs). When the photoluminescent structure 20 is fabricated as thin and as compact as practical, the light extraction efficiency is improved as well, because it provides a shorter travelling path for the light to escape from the inside of the light emitting device 1A to the ambient environment. In an example embodiment, the length of the light emitting device 1A defined by the length of the reflector 30 is equal to or less than about 3.0 mm, and the width of the light emitting device 1A defined by the width of the reflector 30 is equal to or less than about 2.0 mm. In an example embodiment, the length of the photoluminescent structure 20 (e.g., at its upper surface 21) is equal to or less than about 3.0 mm, and the width of the photoluminescent structure 20 (e.g., at its upper surface 21) is equal to or less than about 2.0 mm. The CSP size is typically no more than about 20% larger than that of the LED semiconductor die 10.

The aforementioned paragraphs are detailed descriptions of the embodiments related to the light emitting device 1A. Detailed descriptions of other embodiments of light emitting devices with beveled reflectors according to the present disclosure are explained as follows. It will be appreciated that some detailed descriptions of the features and advantages found in the following embodiments of the light emitting devices are similar to those of the light emitting device 1A and are therefore omitted for the purpose of brevity.

Figure 2:
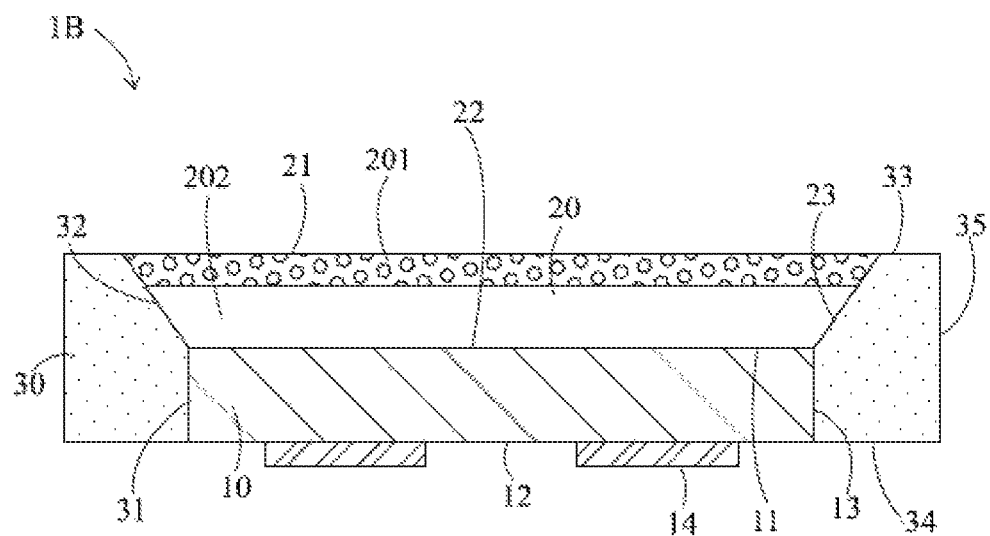
FIG. 2 is a schematic drawing in a cross-sectional view depicting a light emitting device according to another embodiment of the present disclosure.

FIG. 2 shows the schematic drawing in a cross-sectional view of a light emitting device 1B according to another embodiment of the present disclosure. The main difference between the light emitting device 1B and the device 1A is that a transparent spacer layer 202 is formed as part of the photoluminescent structure 20 underneath the phosphor layer 201. In other words, the transparent layer 202 is disposed between the phosphor layer 201 and the upper surface 11 of the LED semiconductor die 10, so that the phosphor layer 201 doesn't make direct contact with the LED semiconductor die 10. One benefit of this embodiment is that the operation temperature of the phosphor layer 201 is lowered because the heat generated from the LED semiconductor die 10 and subsequently transferred to the phosphor layer 201 is alleviated by the transparent spacer layer 202. Thus, the phosphor layer 201 operating at a lower temperature achieves higher conversion efficiency. Additionally, for the purpose of index matching, the RI of the phosphor layer 201 can be chosen to be less than that of the transparent layer 202 to further improve the light extraction efficiency.

Figure 3:
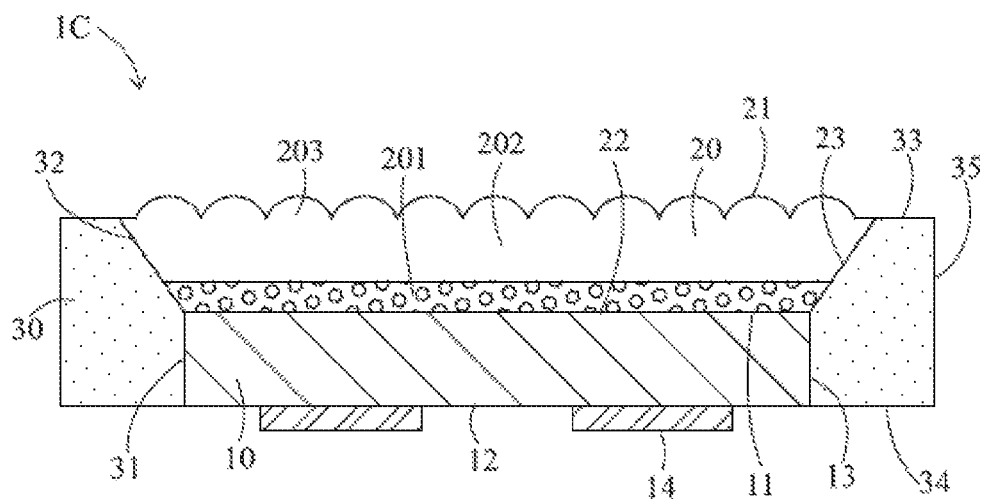
FIG. 3 is a schematic drawing in a cross-sectional view depicting a light emitting device according to another embodiment of the present disclosure.

FIG. 3 shows the schematic drawing in a cross-sectional view of a light emitting device 1C according to another embodiment of the present disclosure. The main difference between the light emitting device 1C and the other embodiments is that the photoluminescent structure 20 further includes a micro-lens array layer 203 formed on top of the phosphor layer 201. The transparent layer 202 can be considered as part of the micro-lens array layer 203, and both layers can be formed in one single fabrication process simultaneously. As for the height, in a cross-sectional view, the micro-lens array layer 203 may be higher than the upper surface 33 of the reflector 30, causing at least some portions of the upper surface 21 of the photoluminescent structure 20 to be slightly higher than the upper surface 33 of the reflector 30. The light extraction efficiency of the light emitting device 1C can be further improved by including the micro-lens array layer 203.

Figure 4:
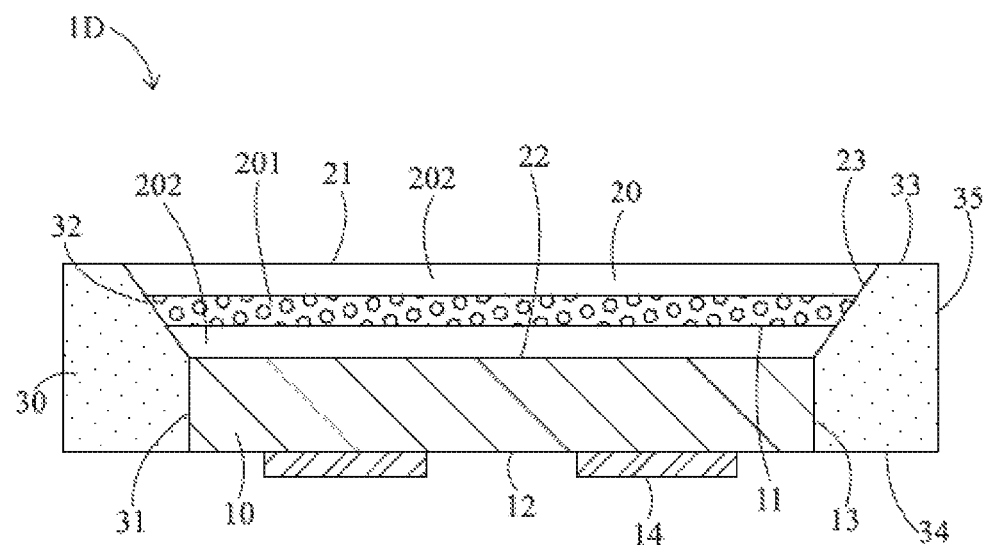
FIG. 4 is a schematic drawing in a cross-sectional view depicting a light emitting device according to another embodiment of the present disclosure.

FIG. 4 shows the schematic drawing in a cross-sectional view of a light emitting device 1D according to another embodiment of the present disclosure. The light emitting device 1D differs from other embodiments, at least in that the photoluminescent structure 20 includes a plurality of the transparent layers 202, and the phosphor layer 201 is disposed and sandwiched between the transparent layers 202. In this embodiment, the transparent layer 202 provides some protection to the phosphor layer 201, along with other benefits such as alleviating the impact of the heat generated from the LED semiconductor die 10 during operation. Also, the RI of the phosphor layer 201 can be less than that of the lower transparent layer 202, but greater than that of the upper transparent layer 202 to improve the light extraction efficiency.

Figure 5:
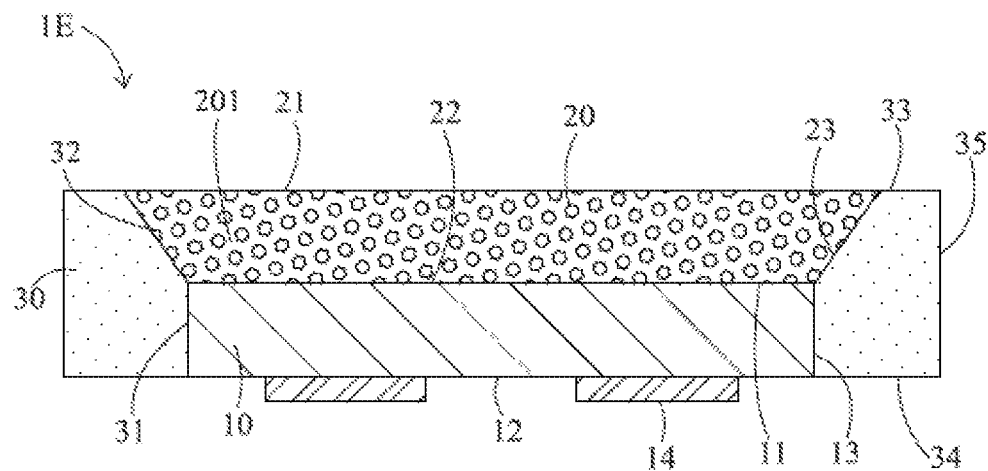
FIG. 5 is a schematic drawing in a cross-sectional view depicting a light emitting device according to another embodiment of the present disclosure.

FIG. 5 shows the schematic drawing in a cross-sectional view of a light emitting device 1E according to another embodiment of the present disclosure. The main difference between the light emitting device 1E and the other embodiments is that the photoluminescent structure 20 of the light emitting device 1E is formed as a single-layer photoluminescent structure, including the phosphor layer 201 without any transparent spacer layer. It will be appreciated that the context of the phosphor layer 201 is not meant to be limited to a single photoluminescent material or a single phosphor layer, but a plurality of homogeneously mixed photoluminescent materials or a plurality of layer-by-layer photoluminescent materials as well. Thus, multiple photoluminescent materials in the phosphor layer 201 can be used to convert a portion of light emitted from the LED semiconductor die 10 into different wavelengths of the light spectrum. This embodiment is desirable for some white LED applications, such as the warm white LEDs with lower correlated color temperature (CCT).

Figure 6:
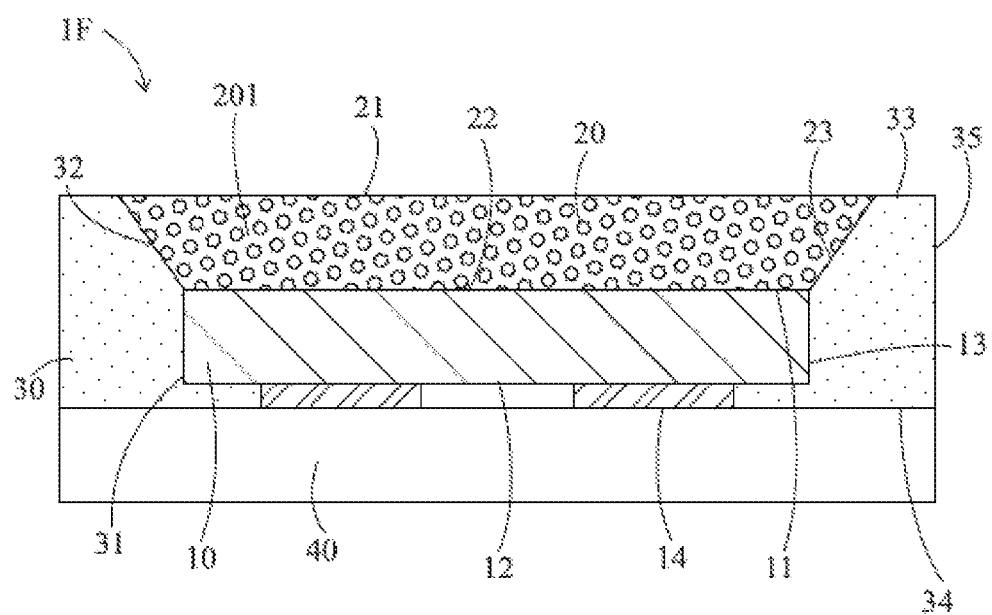
FIG. 6 is a schematic drawing in a cross-sectional view depicting a light emitting device according to another embodiment of the present disclosure.

FIG. 6 shows the schematic drawing in a cross-sectional view of a light emitting device 1F according to another embodiment of the present disclosure. The main difference between the light emitting device 1F and the other embodiments is that the light emitting device 1F further includes a substrate 40 to form a fan-out structure for the electrodes 14 of the LED semiconductor die 10. The LED semiconductor die 10 and the reflector 30 are both disposed onto the substrate 40, and the set of electrodes 14 of the LED semiconductor die 10 is further electrically connected to the substrate 40. The substrate 40 is typically formed as an electrical insulator capable of delivering electricity through a set of via-shaped conductors, strategically placed to connect to the electrodes 14 of the LED semiconductor die 10 and pads underneath the substrate 40. A larger set of electrode pads is therefore formed underneath the substrate 40. Example substrates are ceramic substrates, printed circuit boards (PCBs), lead frames, and so forth. Electrical energy is delivered to drive the light emitting device 1F through the substrate 40 from the underneath electrode pads. As shown in FIG. 6, the reflector 30 may be formed to fill the gap between the substrate 40 and the lower surface 12 of the LED semiconductor die 10. One advantage of this embodiment is that the substrate 40 provides an environmental barrier protector to the LED semiconductor die 10. Another advantage is that enlarged fan-out electrical pads of the light emitting device 1F facilitates the subsequent Surface Mount Technology (SMT) process.

Figure 7:
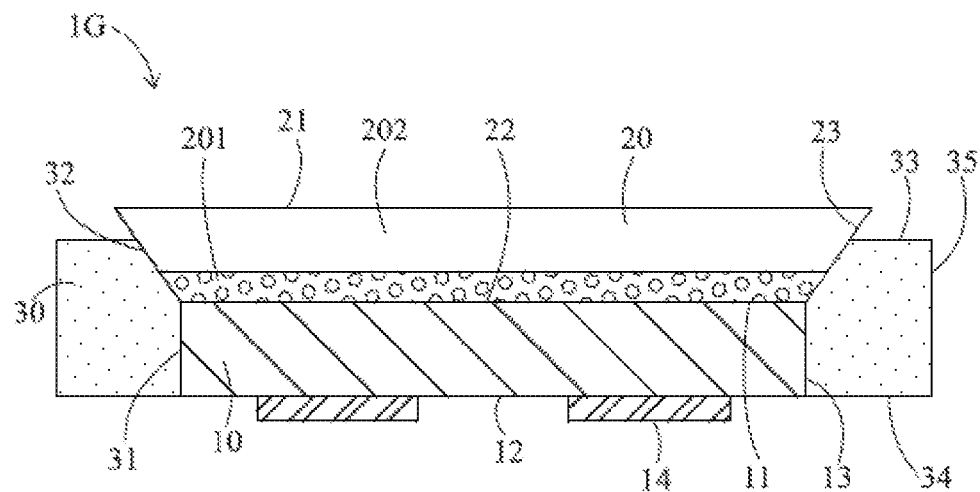
FIG. 7 is a schematic drawing in a cross-sectional view depicting a light emitting device according to another embodiment of the present disclosure.

FIG. 7 shows the schematic drawing in a cross-sectional view of a light emitting device 1G according to another embodiment of the present disclosure. The main difference between the light emitting device 1G and the other embodiments is that the height, in a cross-sectional view, of the upper rim surface 33 of the reflector 30 is lower than that of the upper surface 21 of the photoluminescent structure 20, but higher than that of an upper surface of the phosphor layer 201. In other words, the beveled edge surface 23 of the photoluminescent structure 20 is partially covered by the reflector 30, and partially exposed from the reflector 30. The main benefit of this embodiment is to prevent the reflective resin material from overflowing to the upper surface 21 of the photoluminescent structure 20 during the fabrication process of the reflector 30 either by molding or dispensing, thus improving the manufacturing yield.

Figure 8:
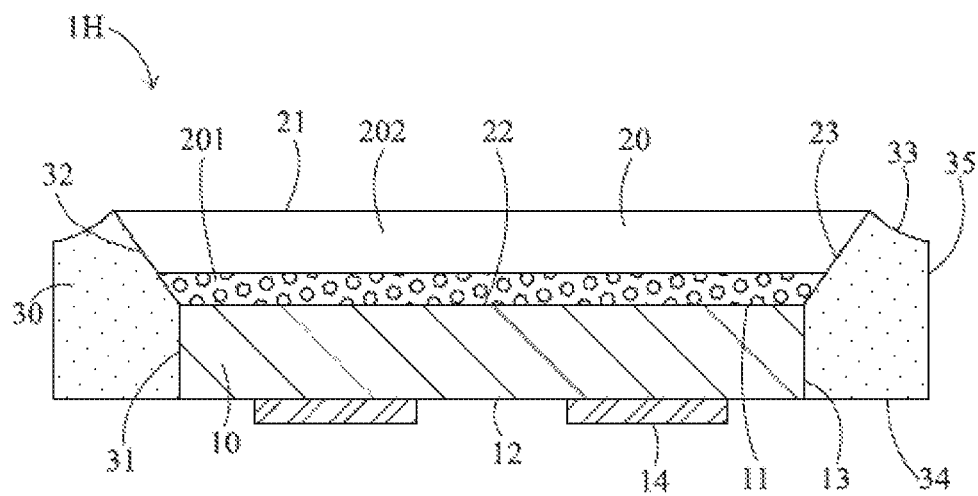
FIG. 8 is a schematic drawing in a cross-sectional view depicting a light emitting device according to another embodiment of the present disclosure.

FIG. 8 shows a schematic drawing in a cross-sectional view of a light emitting device 1H according to another embodiment of the present disclosure. The main difference between the embodiment of the light emitting device 1H and the other embodiments is that instead of being a flat surface, the upper surface 33 of the reflector 30 generally exhibits a concave-shaped surface extending from the outer rim edge of the upper surface 21 of the photoluminescent structure 20. A dispensing method to fabricate the reflector 30 surrounding an electro-luminescent structure, due to the interactions of surface tension and material shrinkage, generally shows a concave upper surface after curing the reflective resin material.

Figure 9:
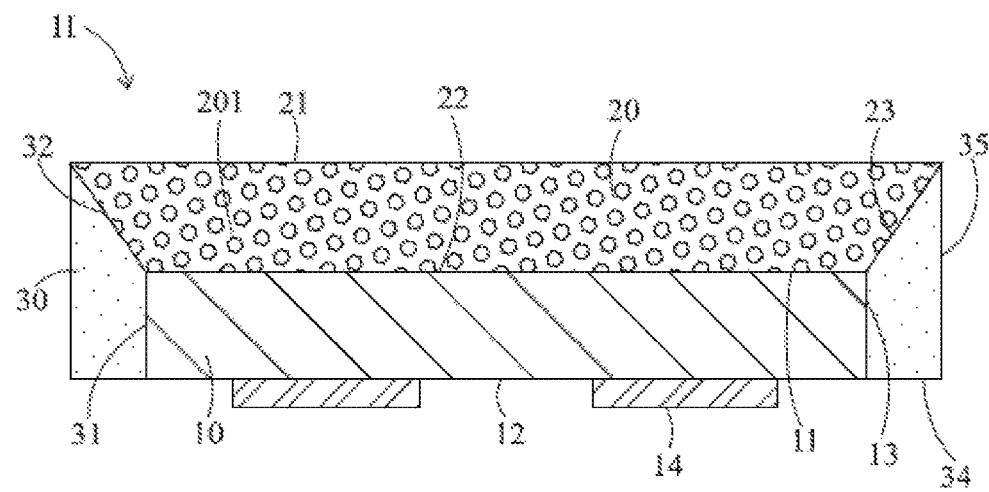
FIG. 9 is a schematic drawing in a cross-sectional view depicting a light emitting device according to another embodiment of the present disclosure.

FIG. 9 shows the schematic drawing in a cross-sectional view of a light emitting device 1I according to another embodiment of the present disclosure. The difference between the light emitting device 1I and the other embodiments is at least that the outer rim edge of the upper surface 21 of the photoluminescent structure 20 precisely adjoins the outer rim edge of the reflector 30. Accordingly, in this embodiment, the dimensions of the reflector 30 can be further reduced and make the light emitting device 1I even more compact.

Figure 10:
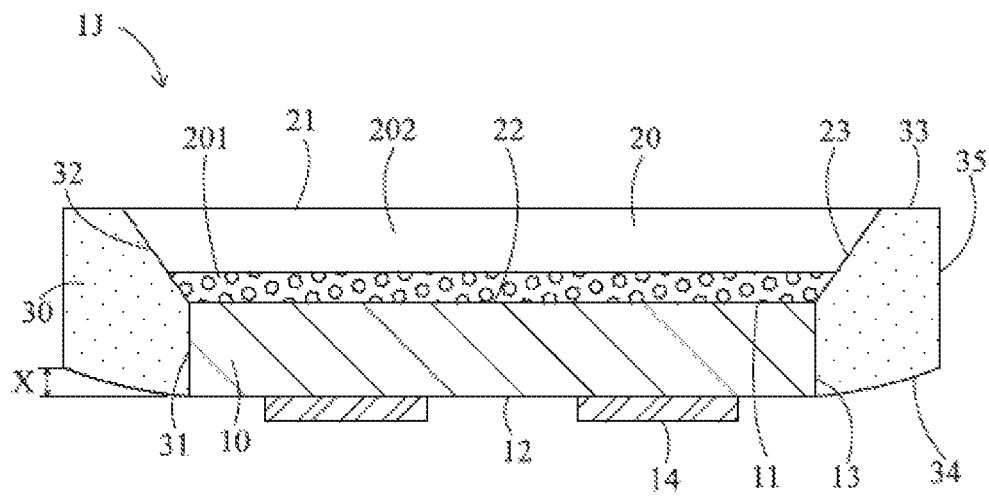
FIG. 10 is a schematic drawing in a cross-sectional view depicting a light emitting device according to another embodiment of the present disclosure.

FIG. 10 shows the schematic drawing in a cross-sectional view of a light emitting device 1J according to another embodiment of the present disclosure. The main difference between the light emitting device 1J and the other embodiments is that the lower surface 34 of the reflector 30 curves upwardly from the lower rim of the inner edge surface 31 of the reflector 30, and a recessed space is formed underneath the light emitting device 1J accordingly. Specifically, the reflector 30 is fabricated using a fluid resin material solidified at a higher curing temperature, for example, such as about 150° C. for silicone resin materials. This curing process from liquid phase to solid phase induces volume shrinkage of the reflector 30 due to the chemical polymerization reaction of the resin material. Also, thermal contraction in volume of the reflector 30 while it cools down from an elevated curing temperature to a room temperature helps to create the recessed structure as well. Under the boundary condition that the deformation of the reflector 30 is constrained by the adjoining edge surface 31 of the reflector 30 interfaced with the edge surface 13 of the LED semiconductor die 10, both chemical shrinkage and physical contraction in volume of the reflector 30 cause an upward curvature of the lower surface 34 of the reflector 30 forming a recessed space.

Creating a recessed space from the lower surface 34 of the reflector 30 has the advantage of improving soldering quality when the light emitting device 1J is adjoining a substrate during subsequent Surface Mount Technology (SMT) bonding process. An example SMT process includes: 1. Dispensing appropriate amounts of soldering paste onto the substrate bonding pads, 2. Picking, aligning, and placing the light emitting device 1J onto the substrate, and 3. Reflowing the soldering paste in a high-temperature oven so that the solder melts, reflows and forms bonding between the light emitting device 1J and the substrate. When the light emitting device 1J and a substrate (not shown in FIG. 10) experience heat in a reflow oven, thermal expansion of the reflector 30 in the vertical direction will generally be much larger than that of the LED semiconductor die 10, because the Coefficient of Thermal Expansion (CTE) is usually much larger for the reflector 30, which is typically made of organic materials, than that for the LED semiconductor die 10, which is typically made of inorganic materials. Thus the lower surface 34 of the reflector 30 will expand more vertically, and then elevate the LED semiconductor die 10 to create a void gap between the LED semiconductor die 10 and the substrate, causing poor bonding between the set of electrodes 14 of the LED semiconductor die 10 and the substrate during the SMT process. However, a recessed space underneath the lower surface 34 of the reflector 30 of the light emitting device 1J according to the present embodiment will provide the room to compensate for the thermal expansion of the reflector 30 during the high-temperature reflow process, thus a gap being avoided.

The height of the recessed space, labeled as X in FIG. 10, is generally determined by the material properties, geometric dimensions of the photoluminescent structure 20 and the reflector 30, and the curing process parameters and so forth. The recessed height, X, can be designed by selecting these tuning factors properly. It is desired that the recessed height, X, is at least about 3 p.m so that it provides enough room to compensate for thermal expansion of the reflector 30 during the SMT process.

Among the aforementioned embodiments of the light emitting devices 1A to 1J, it will be appreciated that the technical aspects and benefits can be applied and combined with one another, and are not restricted to one specific embodiment. For example, the embodiment of a micro-lens array layer 203 of the light emitting device 1C, the embodiment of a substrate 40 of the light emitting device 1F, and the embodiment of a recessed space underneath the lower surface 34 of the light emitting device 1J and so forth can be combined or incorporated to other embodiments. Furthermore, depending on the specific desired optical properties, a plurality of the phosphor layers 201 and/or a plurality of the transparent layers 202 can be introduced to form a photoluminescent structure 20 of the light emitting devices 1A to 1J. It will also be appreciated that other variants of the embodiments, such as changing the layer stacking sequence, and/or further including optically scattering particles, such as $TiO_2$ and the like, can be introduced as well to form a photoluminescent structure 20.

Figure 22A:
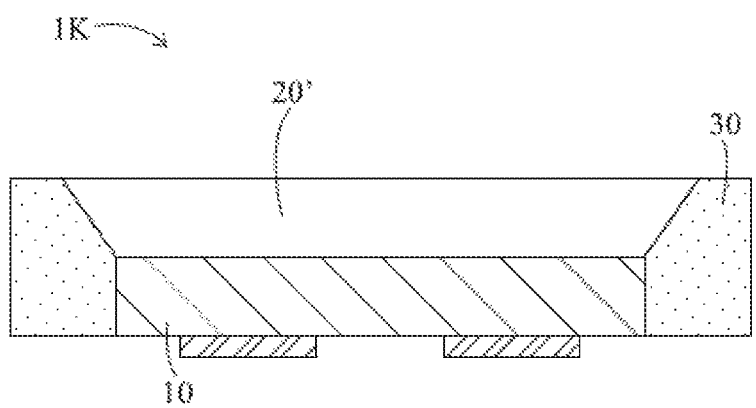
FIG. 22A, FIG. 22B, FIG. 22C, FIG. 22D, and FIG. 22E are schematic drawings in cross-sectional views of a light emitting device according to another embodiment of the present disclosure.

Furthermore, the embodiments of the light emitting devices 1A to 1J according to the present disclosure can also be applied to a monochromatic chip-scale packaging light emitting device 1K, wherein the LED semiconductor die 10 irradiates a substantially monochromatic light spectrum during operation. As shown in FIG. 22A, for the purpose of ease of illustration, the light emitting device 1K is embodied by replacing the photoluminescent structures 20 of the aforementioned light emitting devices with a transparent structure 20' formed using transparent material without phosphor or other photoluminescent materials mixed inside. Thus, the monochromatic wavelength of the light irradiated by the LED semiconductor die 10 will not be converted or Stokeshifted while the light passes through the transparent structure 20' during operation. This embodiment can be used to realize monochromatic chip-scale packaging LEDs such as red, green, blue, infrared, or ultra violet LEDs and so forth. Similar to other embodiments of light emitting devices 1A to 1J, the monochromatic CSP-type LEDs also have the advantages of smaller etendue, reduced light emitting area for easier design of a secondary optical lens, lower thermal resistance, and tunable viewing angles suitable for specific applications and so forth.

Figure 22B:
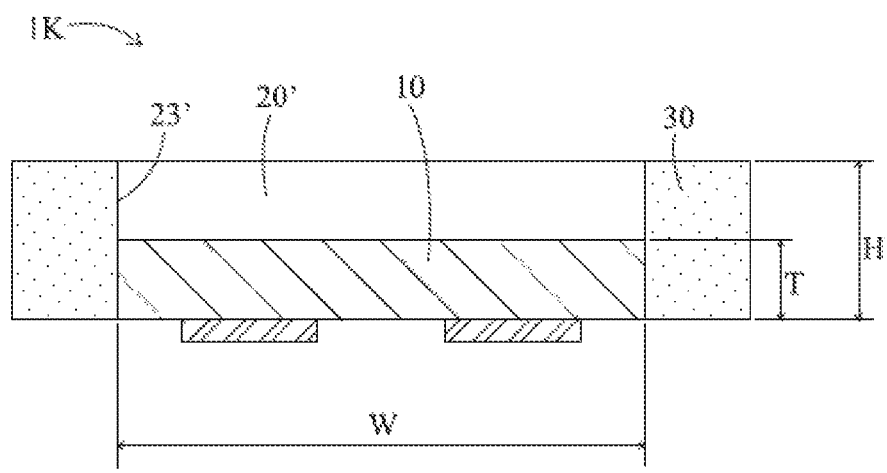

Besides, some applications such as spot lights or vehicle signal lights specify a light source having higher directionality and smaller etendue. As shown in FIG. 22B, by incorporating a vertical edge surface 23' for the photoluminescent structure 20', the divergence angle of the light emitting device 1K can be even smaller, and can be further reduced by further increasing the height H of the reflector 30. It is desired that the height H is equal to or greater than about 0.1 times the length W of the LED semiconductor die 10, and equal to or less than about 5 times the length W of the LED semiconductor die 10, namely the aspect ratio of the reflector 30 being about $0.1 \leq H/W \leq$ about 5. Even though the transparent structure 20' having a vertical edge surface 23' will sacrifice the light extraction efficiency, the luminous flux per unit area, namely illuminance, will be increased in the desired direction for specific applications. It is further desired that the transparent structure 20' is made of a low RI transparent material for the purpose of index matching to the outside environment.

Figure 22C:
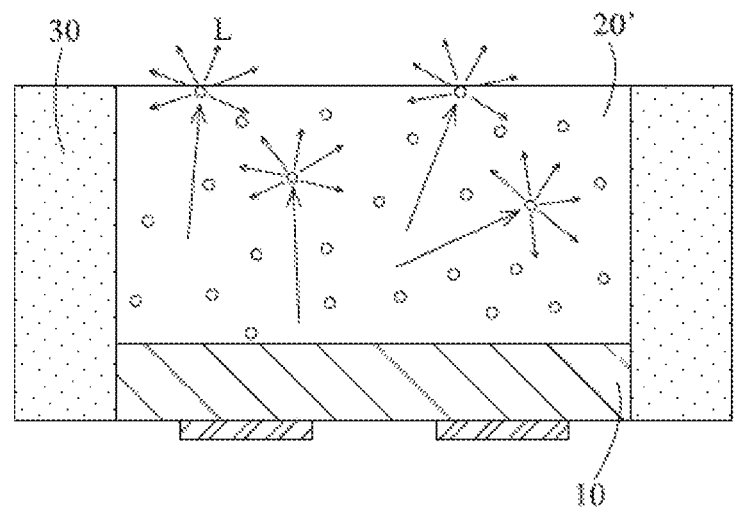
Figure 22D:
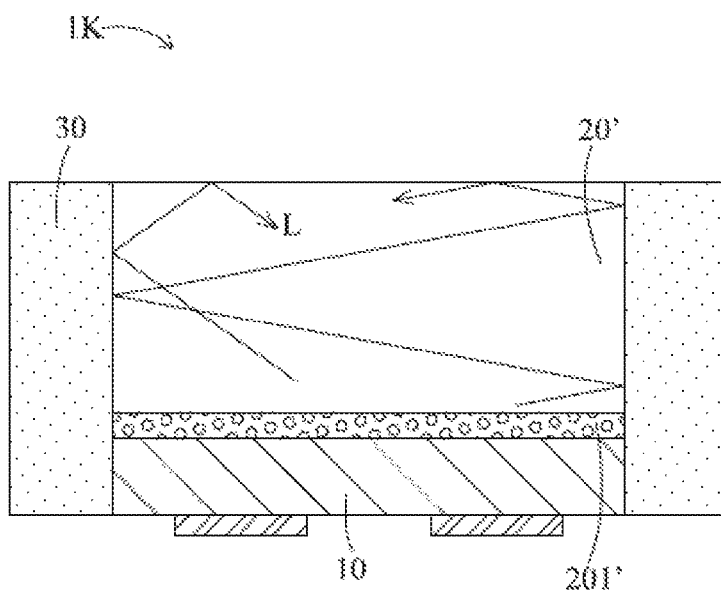
Figure 22E:
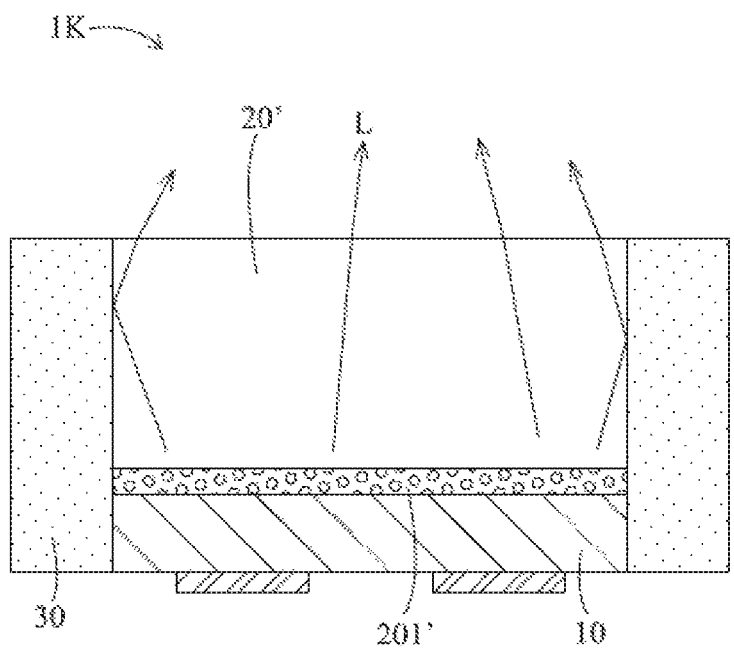

Additionally, a phosphor-converted white CSP light emitting device having a high-aspect-ratio reflector is also desirable for certain applications specifying high illuminance. FIG. 22D illustrates another embodiment of the white CSP light emitting device 1K having a high-aspect-ratio reflector 30. The major difference of this embodiment from that of the monochromatic CSP light emitting device illustrated in FIG. 22B is that a phosphor layer 201' is compactly formed at the bottom of the transparent structure 20 adjacent to the LED semiconductor die 10. If otherwise, as contrasted in FIG. 22C, when a photoluminescent material is randomly dispersed inside the transparent structure 20', the light L may be partially absorbed and re-emitted, or scattered in various directions by particles of the photoluminescent material. This re-scattering effect will impede the purpose of high directionality of the light achieved using a high-aspect-ratio reflector 30. Therefore, to avoid the undesirable light scattering in the transparent structure 20', the phosphor layer 201' is disposed at the bottom of the transparent structure 20' adjacent to the LED semiconductor die 10. As illustrated in FIG. 22D, without randomly dispersed light scattering particles in the transparent structure 20', the light L having large incident angle will be reflected back within the high-aspect-ratio reflector 30, resulting in rapid decay of the trapped light. In contrast, as shown in FIG. 22E, the light L having small incident angle will not be reflected back by the high-aspect-ratio reflector 30, resulting in light escaping from the transparent structure 20' to the outside environment. In other words, the high-aspect-ratio reflector 30 of the light emitting device 1K can substantially filter out the light L having a larger incident angle and pass through the light L having a smaller incident angle.

In some embodiments, the dimensions of the transparent structure 20' for the light emitting device 1K are equal to or slightly larger than those of the LED semiconductor die 10; and the overall dimensions of the device 1K including the reflector 30 are also slightly larger than those of the LED semiconductor die 10. Therefore, the light emitting device 1K having the high-aspect-ratio reflector 30 can realize a high directionality light source embodied in a compact chip-scale packaging size.

Manufacturing methods for the embodiments of the light emitting device 1A to 1J according to the present disclosure are described as follows. The manufacturing methods generally include three major steps: 1. forming a reverse-pyramidal-frustum shaped photoluminescent structure having a beveled edge surface; 2. attaching the photoluminescent structure onto an LED semiconductor die to form an electro-luminescent structure; and 3. disposing a reflective material surrounding the electro-luminescent structure to form a reflector having an inner beveled edge surface adjacent to the reverse-pyramidal-frustum shaped photoluminescent structure. The technical aspects of each manufacturing step are further detailed as follows.

Firstly, methods of forming a photoluminescent structure 20 are disclosed. Methods of forming the photoluminescent structure 20 can generally be categorized into either a direct method or an indirect method. An indirect method of some embodiments generally follows a two-step procedure: a photoluminescent sheet is formed first, and then singulated into a plurality of photoluminescent structures subsequently. In contrast with a direct method of some embodiments, a standalone and substantially complete photoluminescent structure is directly formed without using a singulation process. FIGS. 11A to 11D illustrate a step-by-step manufacturing process of forming the photoluminescent sheet.

Figure 11A:
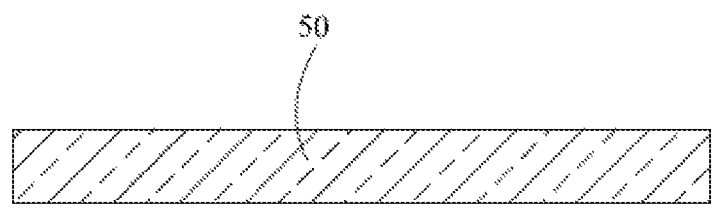
FIG. 11A, FIG. 11B, FIG. 11C, and FIG. 11D are schematic drawings illustrating a method of forming a photoluminescent sheet according to some embodiments of the present disclosure.

As shown in FIG. 11A, firstly, a releasing layer 50 is prepared for further processing to form a photoluminescent sheet. The releasing layer 50 can further be disposed onto a supporting substrate (not shown in FIG. 11A), such as a silicon substrate, a glass substrate, and the like.

Figure 11B:
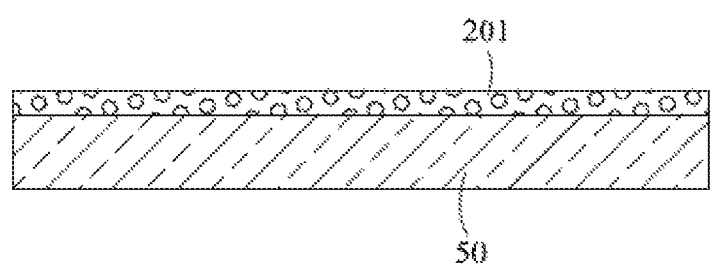

As shown in FIG. 11B, secondly, a phosphor layer 201 is formed on the releasing layer 50. Methods of forming the phosphor layer 201 include spray coating, printing, molding, or other technique of applying phosphors and associated binding resin materials onto the releasing layer 50, and then the phosphor layer 201 is solidified by a curing process. Example methods of forming a phosphor layer disclosed by the US patent applications US2010/0119839 and US2010/0123386 provide a precise control of the thickness and uniformity of the phosphor layer, and the technical contents of which are incorporated herein by reference in their entirety.

Figure 11C:
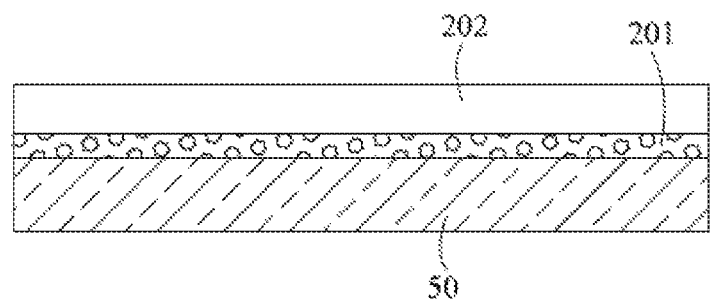

As shown in FIG. 11C, thirdly, a transparent layer 202 is subsequently formed on top of the phosphor layer 201. Fabrication methods include spray coating, printing, molding, dispensing, or other technique. The method of spray coating is desired when a plurality of the transparent layers 202 are included.

Figure 11D:
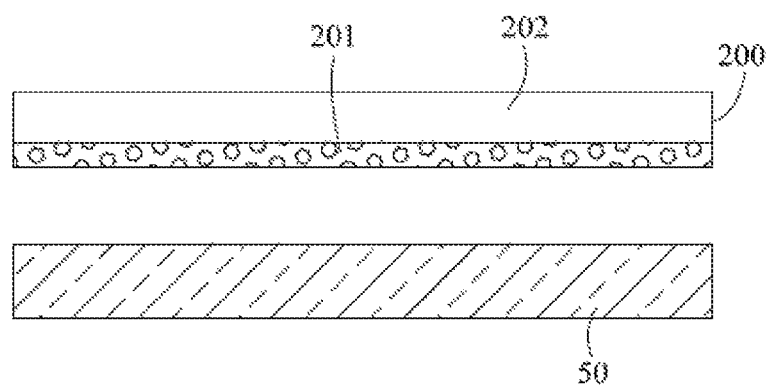

As shown in FIG. 11D, fourthly, after forming the transparent layer 202, the releasing layer 50 is removed to form a stand-alone photoluminescent sheet 200 comprising the phosphor layer 201 and the transparent layer 202. The photoluminescent structure 20 of the light emitting device 1A (FIG. 1), as well as the photoluminescent structures 20 of the light emitting devices 1G, 1H, and 1J (FIGS. 7, 8, and 10) can be fabricated by singulating the photoluminescent sheet 200. Similarly, by singulating a reversely placed photoluminescent sheet 200, the photoluminescent structure 20 of the light emitting device 1B (FIG. 2) is obtained.

Figure 12A:
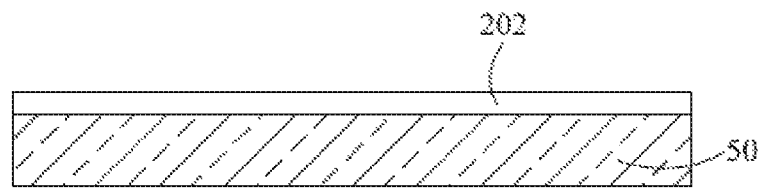
FIG. 12A, FIG. 12B, and FIG. 12C are schematic drawings illustrating a method of forming another photoluminescent sheet according to some embodiments of the present disclosure.
Figure 12B:
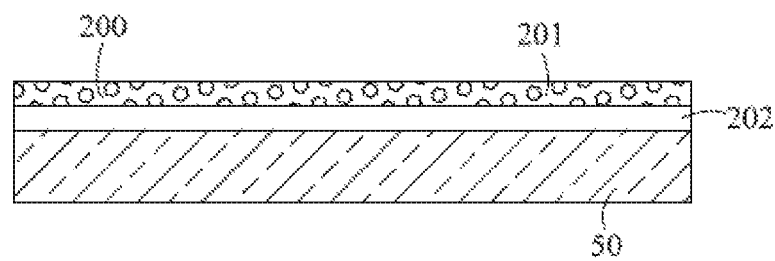
Figure 12C:
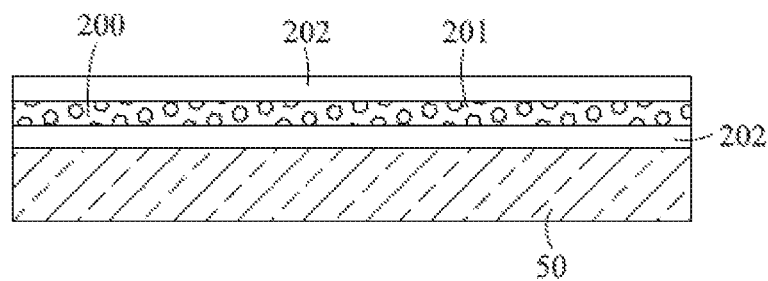
Figure 14:
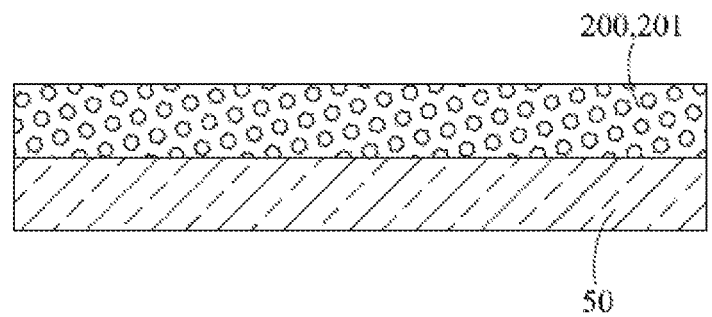
FIG. 14 and FIG. 15 are schematic drawings illustrating a method of forming another photoluminescent sheet according to some embodiments of the present disclosure.

Variants of the embodiments of the photoluminescent sheet 200 can be realized by changing the forming sequence of the phosphor layer 201 and the transparent layer 202. For example, as shown in FIGS. 12A to 12C, a transparent layer 202, a phosphor layer 201, and another transparent layer 202 are formed sequentially on the releasing layer 50 to construct a photoluminescent sheet 200 corresponding to the photoluminescent structure 20 of the light emitting device 1D (FIG. 4). As shown in FIG. 14, a single phosphor layer 201 is formed on the releasing layer 50. This embodiment of the photoluminescent sheet 200 shown in FIG. 14 can be used to further fabricate the photoluminescent structures 20 of the light emitting devices 1E, 1F, and 1I (FIGS. 5, 6, and 9) after singulating the photoluminescent phosphor sheet 200.

Figure 15:
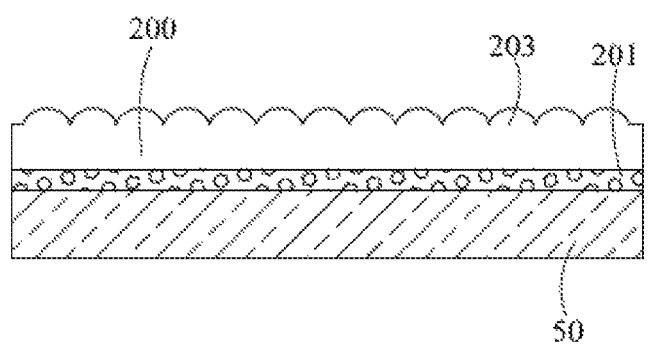

As shown in FIG. 15, after forming a phosphor layer 201, a micro-lens array layer 203 is subsequently formed on top of the phosphor layer 201 to construct another embodiment of the photoluminescent sheet 200. The micro-lens array layer 203 can be fabricated by a molding process. An example embodiment of the molding fabrication process includes: 1. the phosphor layer 201 formed on the releasing layer 50 is placed inside the bottom surface of a mold (not shown); 2. a resin material used to fabricate the micro-lens array layer 203, such as silicone, is injected into the mold from the top, and 3. the micro-lens array layer 203 is subsequently formed after the resin material is cured. A photoluminescent sheet 200 comprising the phosphor layer 201 and the micro-lens array layer 203 can be singulated to fabricate a photoluminescent structure 20 corresponding to that of the light emitting device 1C (FIG. 3).

Singulation of a photoluminescent sheet 200 into a plurality of stand-alone photoluminescent structures 20 is a designed fabrication process, particularly, to form a reverse-pyramidal-frustum shaped photoluminescent structure 20 according to some embodiments of the present disclosure. An example embodiment of the singulation process is a punching process to disjoin or separate the photoluminescent sheet 200 into a plurality of the photoluminescent structures 20 with a desired beveled edge surface.

Figure 16A:
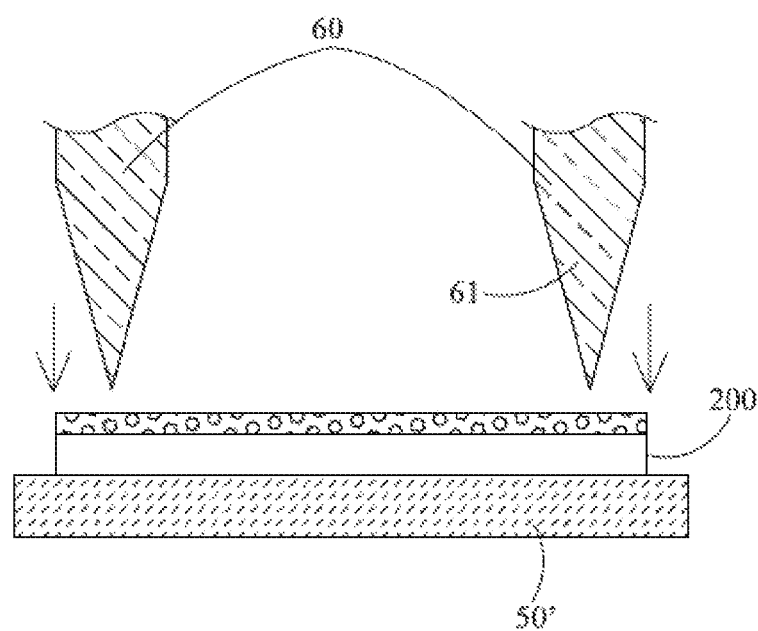
FIG. 16A, FIG. 16B, FIG. 16C, FIG. 16D, FIG. 16E, and FIG. 16F are schematic drawings illustrating a punching method to fabricate photoluminescent structures according to some embodiments of the present disclosure.
Figure 16B:
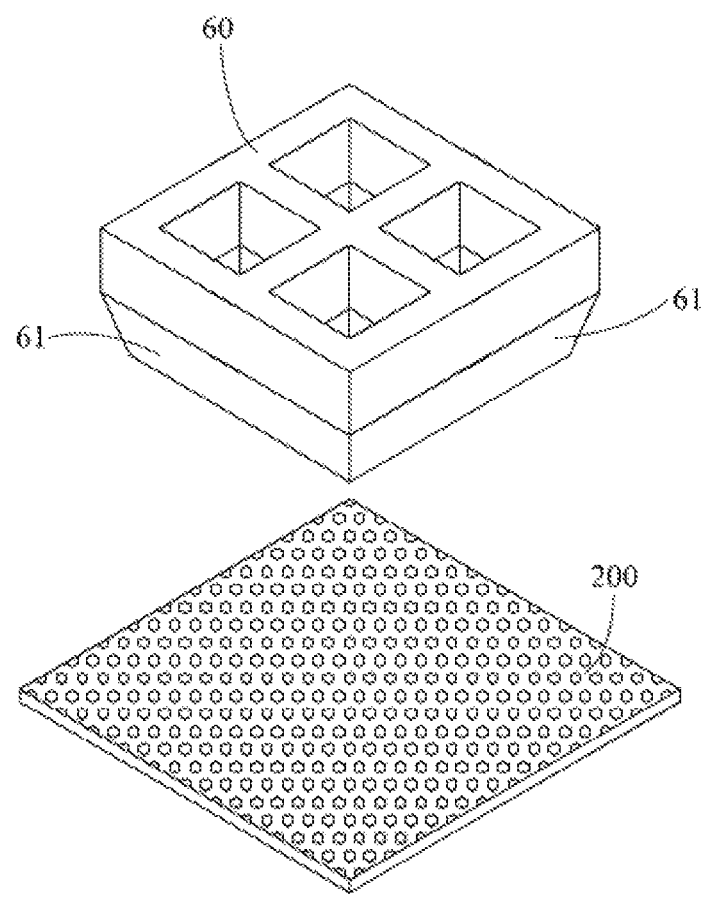
Figure 16C:
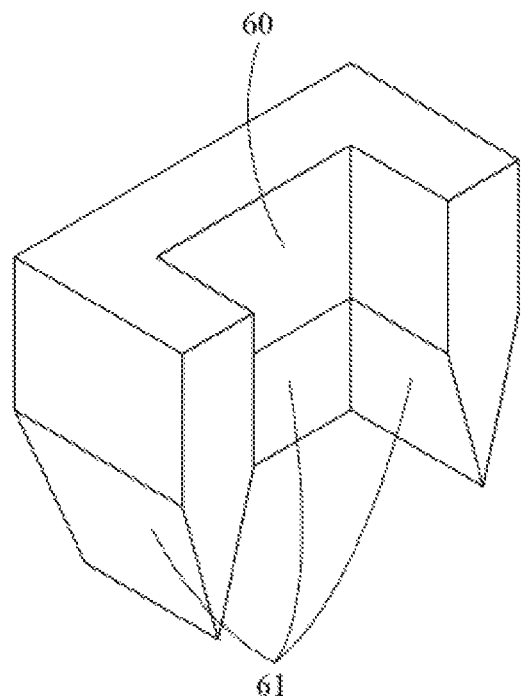
Figure 16D:
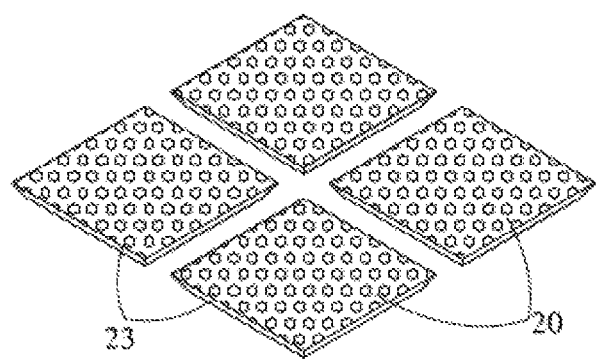
Figure 16E:
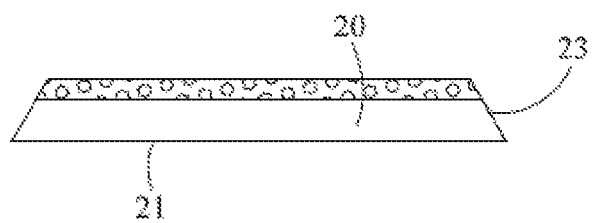
Figure 16F:
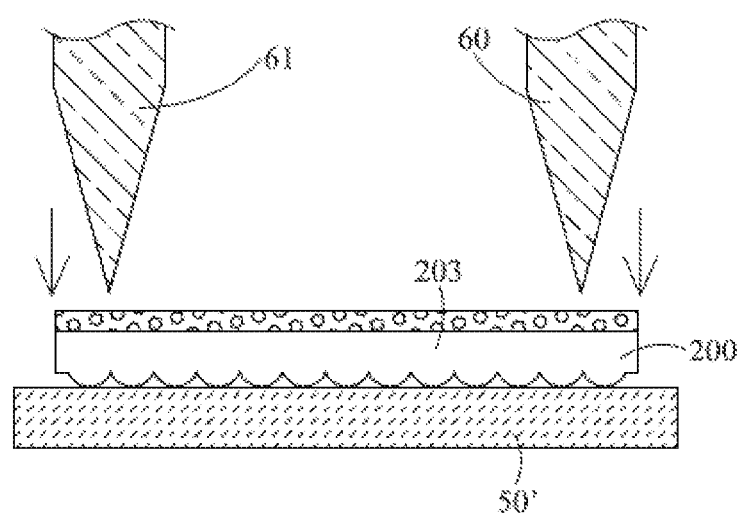

Specifically, as shown in FIGS. 16A and 16B, the photoluminescent sheet 200 is reversely placed on another releasing layer 50', and then punched by a punching tool 60. As shown in FIG. 16C, the punching tool 60 has a plurality of array-like punching blades 61. The blades 61 are connected to one another and arranged according to a desired mechanical shape of the photoluminescent structure 20, such as a square array. Therefore, as shown in FIG. 16D, the photoluminescent sheet 200 can be singulated into a plurality of the photoluminescent structures 20 with a single punching process using the punching tool 60. After punching, an upper surface 21 of the photoluminescent structure 20 with the desired beveled shape is facing downward, as illustrated in FIG. 16E. Similarly, a photoluminescent structure 20 with a micro-lens array can be fabricated using the same singulation process, as shown in FIG. 16F.

Therefore, the punching process provides an embodiment of the methods to effectively singulate the photoluminescent sheet 200 into a plurality of the photoluminescent structures 20 with desired beveled shapes. Furthermore, a slanted angle of the beveled edge surface 23 of the photoluminescent structure 20 can be pre-determined by several design factors, such as the blade angle profile, the mechanical dimensions of the photoluminescent structure 20, the elastic or plastic material properties of the photoluminescent sheet 200, and so forth. These factors can be pre-designed to obtain a desired slanted angle of the beveled edge surface 23.

Figure 17:
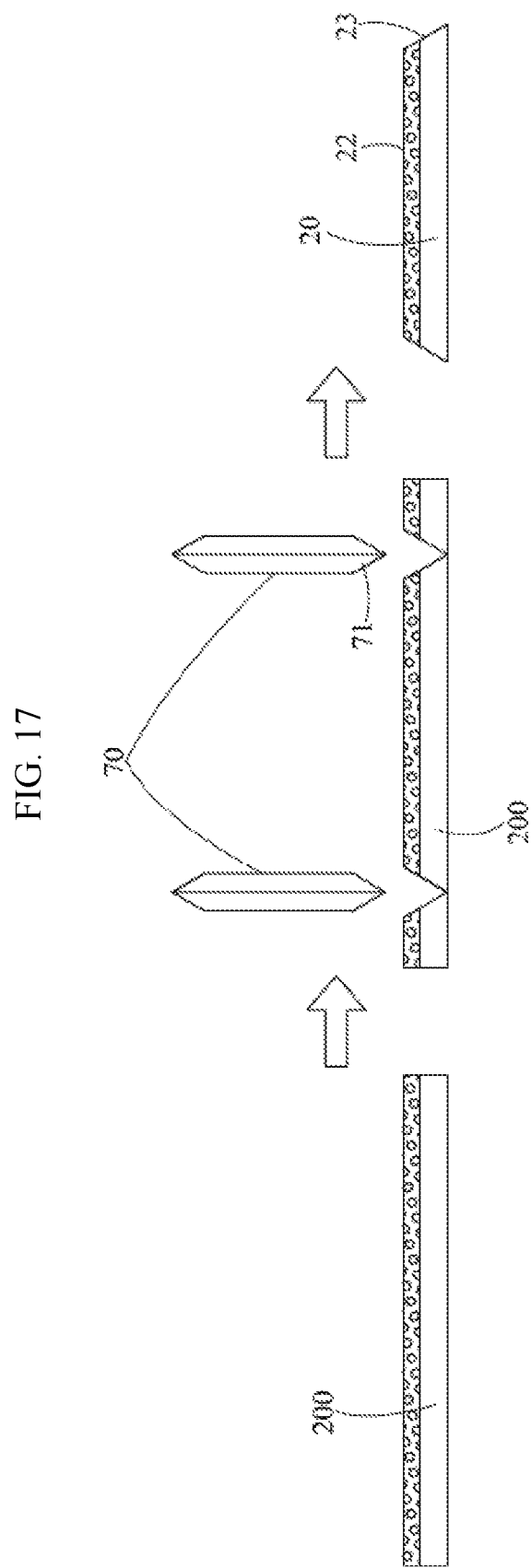
FIG. 17 is a schematic drawing illustrating a dicing method to fabricate photoluminescent structures according to some embodiments of the present disclosure.

It will be appreciated that other singulation methods, such as sawing using a dicing saw or water-jet saw, precision machining, micromachining, and so forth, can also be utilized to disjoin the photoluminescent sheet 200 into a plurality of the photoluminescent structures 20. As shown in FIG. 17, a saw such as a dual-angle milling cutter 70 is used to cut and separate the photoluminescent sheet 200 into a plurality of the photoluminescent structures 20. Similarly, a lower surface 22 of the photoluminescent structure 20 faces toward blades 71 of the dual-angle milling cutter 70, so that a desired beveled edge surface 23 is formed accordingly. The desired angle of the beveled edge surface 23 of the photoluminescent structure 20 can be machined out and controlled by the angle profile of the blades 71. In another embodiment of the singulation method of the photoluminescent sheet 200, micromachining through hard mask deposition, pattern definition, etching, and so forth can be used to form the desired photoluminescent structure 20.

The aforementioned manufacturing processes illustrate indirect methods of forming a photoluminescent structure 20 by singulating a photoluminescent sheet 200. However, through manufacturing processes of molding or micromachining, a photoluminescent structure 20 can be independently and directly formed without using a singulation process. An example embodiment of the direct method using a molding process includes the following manufacturing steps: firstly, a mold (not shown) with a plurality of cavities arranged in an array manner and each cavity defining the shape of the photoluminescent structure 20, is provided; secondly, a slurry material used to fabricate the photoluminescent structure 20, for example a silicone resin mixed with phosphors, is injected into the array of cavities inside the mold; and thirdly, the photoluminescent structures 20 are formed after the slurry material is cured. In another embodiment using micromachining, processes including coating of a slurry material, lithography, development, and/or etching can be used to form a photoluminescent structure 20 directly. It will be appreciated that the methods of both the molding and the micromachining process are batch processes feasible to fabricate a plurality of the photoluminescent structures 20 simultaneously so that manufacturing costs are reduced.

It will further be appreciated that not only transparent organic resin materials, such as silicone resin, but also transparent inorganic materials, such as glass, ceramic, and the like, can also be used to form a photoluminescent structure 20. An example embodiment of an indirect method to fabricate a photoluminescent structure 20 using inorganic materials is a sintering process, detailed as follows. Firstly, a photoluminescent plate is formed using a high-temperature sintering process; and secondly, the photoluminescent plate is singulated into a plurality of the photoluminescent structures 20 using methods of sawing or the like. A sintering process as another example embodiment of a direct method to fabricate a photoluminescent structure 20 made of inorganic materials is also detailed as follows. Particles of photoluminescent materials and transparent materials are fed and placed inside a sintering mold, then heated to an elevated temperature to directly form a plurality of the photoluminescent structures 20. It will be appreciated that these methods of manufacturing the photoluminescent structures 20 are also applicable to manufacturing the transparent structures 20'. Similarly, a plurality of the transparent structures 20' can also be formed by singulating a glass substrate or a ceramic substrate using methods of sawing or the like.

Figure 18A:
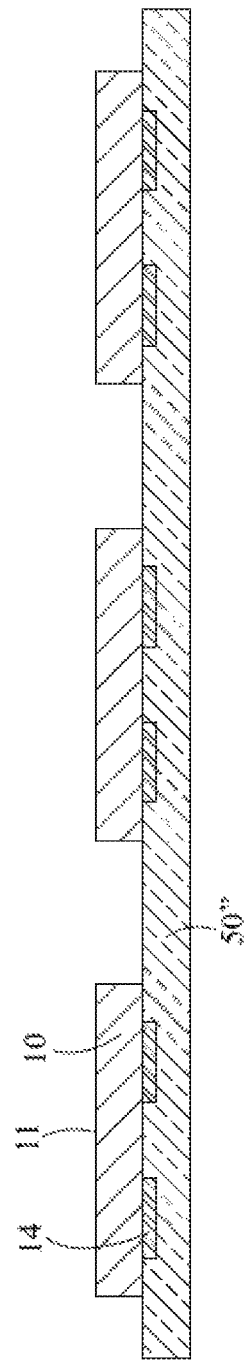
FIG. 18A and FIG. 18B are schematic drawings of a process flow to form electro-luminescent structures for manufacturing a light emitting device according to some embodiments of the present disclosure.
Figure 18B:
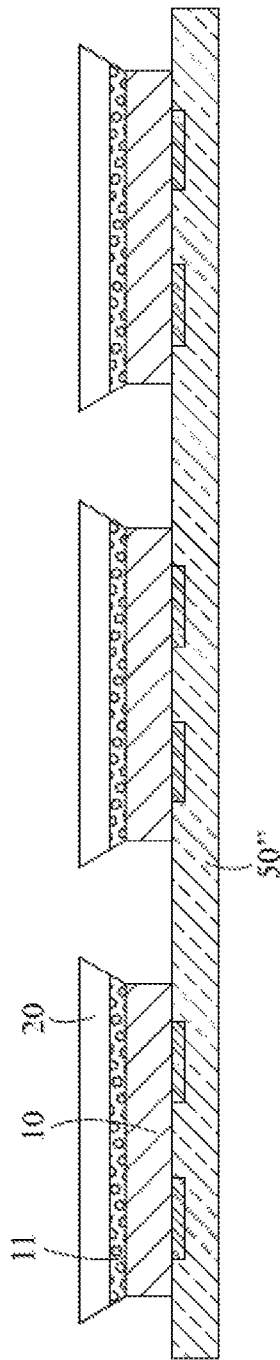

After forming a photoluminescent structure 20 using various methods disclosed above, secondly, a bonding process joining the photoluminescent structure 20 to a LED semiconductor die 10 is disclosed. In FIGS. 18A and 18B, a process of forming an electro-luminescent structure, comprising an LED semiconductor die 10 and a photoluminescent structure 20, is illustrated. Firstly, a plurality of LED semiconductor dies 10 are arranged on a releasing layer 50" as an array of LED semiconductor dies 10 with a fixed distance of pitch. An example embodiment of the releasing layer 50" is an UV releasing tape, or a thermal releasing tape. It is desired that each set of electrodes 14 of the array of the LED semiconductor dies 10 is placed and pressed forcefully so that they are embedded inside the soft releasing layer 50". This will mitigate against contamination of the electrodes 14 during subsequent processing. As for fabricating a light emitting device 1F according to the embodiment shown in FIG. 6, an array of the LED semiconductor dies 10 are arranged on a substrate 40 instead of on a releasing layer 50".

As shown in FIG. 18B, an array of the photoluminescent structures 20 are subsequently attached onto upper surfaces 11 of the pre-arranged array of LED semiconductor dies 10. It is desired that the attachment process is precisely controlled and aligned so that the lower surface 22 of the photoluminescent structure 20 substantially fully covers the upper surface 11 of the LED semiconductor die 10. The photoluminescent structure 20 can be joined to the upper surface 11 of the LED semiconductor die 10 using an adhesive material or an adhesive tape. Therefore, an electro-luminescent structure, comprising the LED semiconductor die 10 and the photoluminescent structure 20, is formed.

Figure 19:
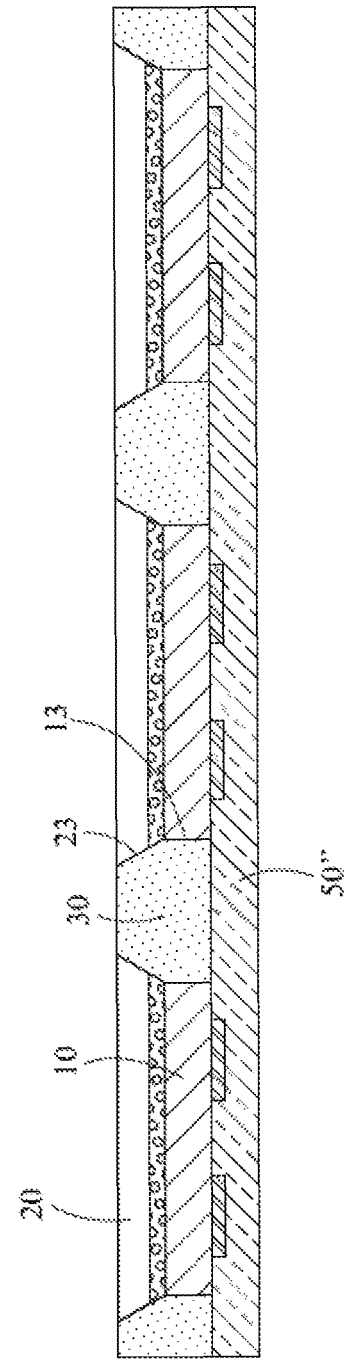
FIG. 19 is a schematic drawing illustrating a fabrication process of forming reflective structures for manufacturing a light emitting device according to some embodiments of the present disclosure.

After the bonding process, thirdly, a manufacturing process of forming a reflector 30 surrounding the electro-luminescent structure is disclosed. As illustrated in FIG. 19, a resin material of the reflector 30 is disposed surrounding the edge surface 13 of the LED semiconductor die 10 and the beveled edge surface 23 of the photoluminescent structure 20 simultaneously to form the reflector 30. An example disposing method is molding or dispensing. As for an example molding process, firstly, an array of the electro-luminescent structures pre-arranged on the releasing layer 50" is placed inside a mold (not shown); secondly, a resin material used to fabricate the reflector 30 is injected into the mold surrounding both the edge surface 13 of the LED semiconductor die 10 and the beveled edge surface 23 of the photoluminescent structure 20; and thirdly, the reflector 30 is formed after curing the resin material.

As for fabricating the reflector 30 using a dispensing process, a mold may be omitted. An example dispensing method is: firstly, a resin material used to fabricate the reflector 30 is dispensed, for example, using a needle syringe to directly dispense the resin material into the gap among the array of the electro-luminescent structures pre-arranged on top of the releasing layer 50". Secondly, the dispensed volume is gradually increased until it substantially fully covers the edge surface 13 of the LED semiconductor die 10 and the beveled edge surface 23 of the photoluminescent structure 20. It will be appreciated that the amount of the reflector resin material is controlled precisely so that it will not be over-spilled to contaminate the upper surface 21 of the photoluminescent structure 20. Finally, the reflector 30 is formed after curing the resin material.

Similarly, the embodiments of the light emitting devices shown in FIGS. 7 and 8 can be fabricated by further shaping the reflector 30 via reducing the total amount of the dispensed resin material of the reflector 30.

Figure 20:
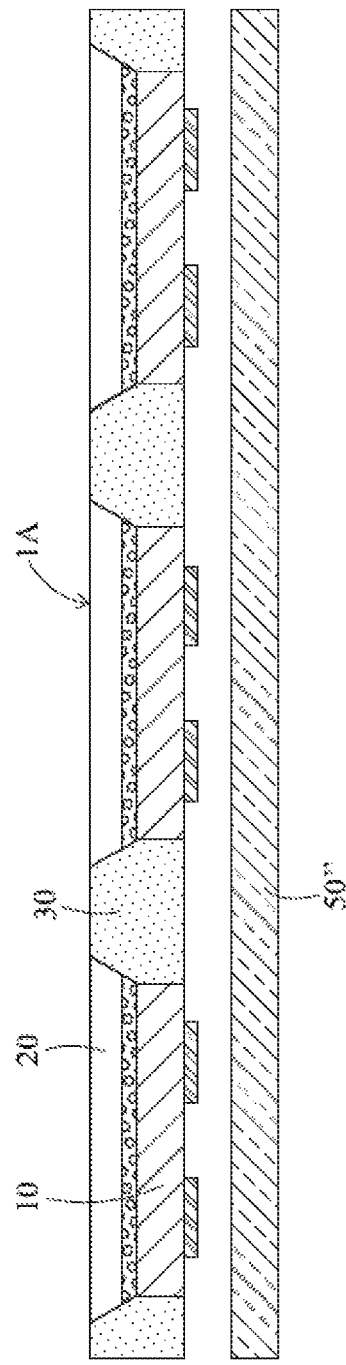
FIG. 20 is a schematic drawing illustrating a fabrication process of removing a releasing layer to fabricate a light emitting device according to some embodiments of the present disclosure.
Figure 21:
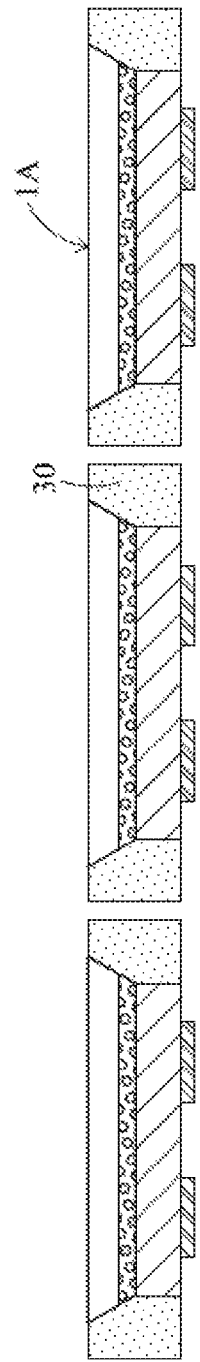
FIG. 21 is a schematic drawing illustrating a fabrication process of dicing reflective structures to fabricate a light emitting device according to some embodiments of the present disclosure.

After the reflector forming process, lastly, a singulation process is disclosed. Once the reflector 30 is formed, as shown in FIG. 20, the releasing layer 50" can be removed to obtain an array of the light emitting devices, for example, device 1A. A dicing process, as shown in FIG. 21, is used to singulate the reflector 30 to obtain a plurality of the light emitting devices 1A.

In summary for some embodiments, the manufacturing methods to fabricate light emitting devices in the present disclosure comprise of four major steps: firstly, forming a plurality of photoluminescent structures 20; secondly, attaching and bonding the photoluminescent structures 20 to an array of LED semiconductor dies 10 to form an array of electro-luminescent structures; thirdly, forming an array of reflectors 30 surrounding the array of electro-luminescent structures; and fourthly, dicing the array of reflectors 30 to form a plurality of individual light emitting devices.

It will be appreciated that the manufacturing methods to fabricate light emitting devices in the present disclosure can also be used to manufacture different embodiments of light emitting devices with beveled reflectors. The disclosed manufacturing methods are desirable to fabricate light emitting devices with small form factors, particularly to fabricate CSP-type LEDs. Furthermore, the disclosed manufacturing methods can also be applied to fabricate photoluminescent structures in a batch-processing manner. It will also be appreciated that the disclosed manufacturing methods can be used to form a reflector surrounding an LED semiconductor die without using a mold.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light emitting device comprising:
   a light emitting diode (LED) semiconductor die comprising an upper surface, a lower surface opposite to the upper surface, an edge surface, and a set of electrodes, wherein the edge surface of the LED semiconductor die extends between the upper surface of the LED semiconductor die and the lower surface of the LED semiconductor die, and the set of electrodes is disposed on the lower surface of the LED semiconductor die;
   a photoluminescent structure disposed on the LED semiconductor die, comprising an upper surface, a lower surface opposite to the upper surface, and an edge surface extending between the upper surface of the photoluminescent structure and the lower surface of the photoluminescent structure, wherein the upper surface of the photoluminescent structure is larger than the lower surface of the photoluminescent structure, such that the edge surface of the photoluminescent structure is a beveled edge surface, and the lower surface of the photoluminescent structure is adjacent to the upper surface of the LED semiconductor die, wherein the photoluminescent structure comprises a phosphor layer and a transparent layer, which is disposed on top of the phosphor layer; and a reflector, comprising an upper surface, a lower surface opposite to the upper surface, and an outer edge surface extending between the upper surface of the reflector and the lower surface of the reflector, the reflector covering the edge surface of the LED semiconductor die and the beveled edge surface of the photoluminescent structure, wherein an entire outer rim of the upper surface of the reflector is lower than and not coplanar with the upper surface of the photoluminescent structure and is higher than an upper surface of the phosphor layer, the lower surface of the reflector adjoins the lower surface of the LED semiconductor die, and the lower surface of the reflector does not extend below the lower surface of the LED semiconductor die.

2. The light emitting device according to claim 1, wherein a size of the lower surface of the photoluminescent structure is equal to or larger than a size of the upper surface of the LED semiconductor die.

3. The light emitting device according to claim 1, wherein the reflector comprising a transparent resin material and reflective particles dispersed within the transparent resin material.

4. The light emitting device according to claim 3, wherein the transparent resin material comprises at least one of polyphthalamide, polycyclohexylene-dimethylene terephthalate, epoxy molding compound, or silicone resin; and the reflective particles comprise at least one of $TiO_2$, BN, $SiO_2$, or $Al_2O_3$.

5. The light emitting device according to claim 3, wherein the transparent resin material has a refraction index ranging from 1.35 to 1.55.

6. The light emitting device according to claim 3, wherein the reflective particles have a particle size ranging from 150 nm to 450 nm.

7. The light emitting device according to claim 1, wherein the reflector has an inner edge surface adjacent to the edge surface of the LED semiconductor die, and an inner beveled edge surface adjacent to the beveled edge surface of the photoluminescent structure.

8. The light emitting device according to claim 1, wherein a refraction index of the transparent layer is lower than a refraction index of the phosphor layer.

9. The light emitting device according to claim 1, wherein the lower surface of the photoluminescent structure fully covers the upper surface of the LED semiconductor die as viewed from a direction perpendicular to the lower surface of the photoluminescent structure.

10. The light emitting device according to claim 1, wherein the upper surface of the reflector, which adjoins a rim of the upper surface of the photoluminescent structure, is concave in shape.

11. The light emitting device according to claim 1, wherein a width of the reflector is equal to or less than 2.0 mm, and a length of the reflector is equal to or less than 3.0 mm.

12. The light emitting device according to claim 1, wherein a size of the lower surface of the photoluminescent structure is larger than a size of the upper surface of the LED semiconductor die.

13. The light emitting device according to claim 1, wherein the set of electrodes of the LED semiconductor die is exposed from the reflector.

14. A light emitting device comprising:
an LED semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die;

a transparent structure disposed on top of the LED semiconductor die, comprising an upper surface, a lower surface opposite to the upper surface, and an edge surface extending between the upper surface of the transparent structure and the lower surface of the transparent structure, wherein a size of the upper surface of the transparent structure is equal to or larger than a size of the lower surface of the transparent structure, and the lower surface of the transparent structure is adjacent to the upper surface of the LED semiconductor die; and a reflector, comprising an upper surface, a lower surface opposite to the upper surface, and an outer edge surface extending between the upper surface of the reflector and the lower surface of the reflector, the reflector covering the edge surface of the LED semiconductor die and the edge surface of the transparent structure, wherein a height of the reflector is equal to or greater than 0.1 times a length of the LED semiconductor die, and is equal to or less than 5 times the length of the LED semiconductor die, and wherein an entire outer rim of the upper surface of the reflector is lower than and not coplanar with the upper surface of the transparent structure, the lower surface of the reflector adjoins the lower surface of the LED semiconductor die, and the lower surface of the reflector does not extend below the lower surface of the LED semiconductor die.

15. The light emitting device according to claim 14, wherein the transparent structure comprises a resin material.

16. The light emitting device according to claim 14, wherein a bottom portion of the transparent structure further comprises a phosphor layer.

17. The light emitting device according to claim 16, wherein the outer rim of the upper surface of the reflector is higher than an upper surface of the phosphor layer.

* * * * *